US012796253B2

(12) United States Patent
Lee et al.

(10) Patent No.: US 12,796,253 B2
(45) Date of Patent: Nov. 10, 2026

(54) DISPLAY DEVICE

(71) Applicant: Samsung Display Co., LTD., Yongin-si (KR)

(72) Inventors: Dong Hyun Lee, Yongin-si (KR); Si Joon Song, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 333 days.

(21) Appl. No.: 18/673,867

(22) Filed: May 24, 2024

(65) Prior Publication Data

US 2025/0107360 A1 Mar. 27, 2025

(30) Foreign Application Priority Data

Sep. 27, 2023 (KR) ........................ 10-2023-0131099

(51) Int. Cl.
*H10K 59/131* (2023.01)

(52) U.S. Cl.
CPC .................................. *H10K 59/131* (2023.02)

(58) Field of Classification Search
CPC .. H10K 59/131; H10K 59/40; H10K 59/1213; H10K 59/873; H10K 77/10
See application file for complete search history.

(56) References Cited

U.S. PATENT DOCUMENTS 11,061,505 B2 * 7/2021 Jang ...................... G06F 3/0412
11,444,144 B2 * 9/2022 Kim .................... G02F 1/13458
2020/0194714 A1 * 6/2020 Won ................... H10K 59/8731
2021/0343811 A1 * 11/2021 Kim ...................... H10K 59/124
2023/0045292 A1 * 2/2023 Cheng ........................ G02F 1/13
2023/0292563 A1 * 9/2023 Park ...................... H10K 59/131
2024/0334776 A1 * 10/2024 Tang ...................... H10K 59/40
2025/0056983 A1 * 2/2025 Lee ....................... G06F 3/0412

FOREIGN PATENT DOCUMENTS

EP 3413180 A1 * 12/2018 ........... G06F 3/0443
EP 4132230 A1 * 2/2023 ............. H05K 1/189
JP 2017161887 A 9/2017
KR 1020220016347 A 2/2022

* cited by examiner

*Primary Examiner* — Tuyen K Vo
(74) *Attorney, Agent, or Firm* — CANTOR COLBURN LLP

(57) ABSTRACT

A display device includes a substrate including first and second substrates, and first and second barrier layers, and a pad unit disposed in a non-display area of the substrate and including pads connected to a driving board under the first substrate. Each of the pads includes an inorganic layer and a pad electrode in a pad contact hole defined through the second substrate and the second barrier layer, a rear pad line on the first barrier layer and connected to the pad electrode through a middle hole defined through the inorganic layer, and a rear pad electrode extending from the rear pad line and connected to the driving board through a rear contact hole defined through the first substrate. A pad defining layer including a laser absorption layer and the first barrier layer and a protrusion pattern covering the pad defining layer are disposed between neighboring rear pad electrodes.

20 Claims, 21 Drawing Sheets

DISPLAY DEVICE

This application claims priority to Korean Patent Application No. 10-2023-0131099, filed on Sep. 27, 2023, and all the benefits accruing therefrom under 35 U.S.C. § 119, the content of which in its entirety is herein incorporated by reference.

BACKGROUND

1. Field

The disclosure relates to a display device.

2. Description of the Related Art

As the information society develops, demands for display devices for displaying images are increasing in various forms. The display devices may be flat panel display devices such as liquid crystal display devices, field emission display devices, and light emitting display devices. The light emitting display devices may include organic light emitting display devices including organic light emitting diode elements as light emitting elements or light emitting diode display devices including inorganic light emitting diode elements, such as light emitting diodes, as light emitting elements.

A display panel of a display device typically includes a display area where pixels for displaying images are disposed and a non-display area (or a bezel area) disposed around the display area. Lines for driving the pixels may be disposed in the non-display area. The non-display area of the display panel is an area that does not display images. As the area of the non-display area is reduced, the area of the display area can be relatively increased.

SUMMARY

Embodiments of the disclosure provide a display device in which the area of a display area is increased by reducing the area of a non-display area.

According to an embodiment of the disclosure, a display device includes a substrate including a first substrate, a first barrier layer, a second barrier layer, and a second substrate, which are sequentially stacked therein, a thin-film transistor layer, a light emitting element layer, an encapsulation layer, and a touch sensing unit, which are sequentially stacked on the second substrate, and a pad unit disposed in a non-display area of the substrate and including a plurality of pads connected to a driving board disposed on the first substrate. In such an embodiment, each of the pads includes an inorganic layer and a pad electrode sequentially stacked on an inner circumferential surface of a pad contact hole defined through the second substrate and the second barrier layer, a rear pad line disposed on the first barrier layer and connected to the pad electrode through a middle hole defined through the inorganic layer inside the pad contact hole, and a rear pad electrode extending from the rear pad line and connected to the driving board under the substrate through a rear contact hole defined through the first substrate. In such an embodiment, a pad defining layer and a protrusion pattern covering the pad defining layer from under the substrate are disposed between neighboring rear pad electrodes, where the pad defining layer includes a laser absorption layer and the first barrier layer.

In an embodiment, the laser absorption layer may be disposed between the first substrate and the first barrier layer.

In an embodiment, a plurality of first openings and a second opening disposed between neighboring first openings may be defined through the pad defining layer, and the rear pad electrodes may be disposed in the first openings.

In an embodiment, the laser absorption layer of the pad defining layer may be disconnected in the second opening.

In an embodiment, the second opening of the pad defining layer may be covered by the second barrier layer.

In an embodiment, the laser absorption layer may include a semiconductor layer. The semiconductor layer of the laser absorption layer may include amorphous silicon.

In an embodiment, a depth of the protrusion pattern in a thickness direction of the substrate may be lower than a depth of the rear contact hole in the thickness direction of the substrate.

In an embodiment, the protrusion pattern has a tapered tape having a width decreasing as being toward a bottom surface of the substrate.

In an embodiment, the protrusion pattern has a dome shape having a curved surface facing toward a bottom surface of the substrate.

In an embodiment, a groove may be defined in the protrusion pattern may to be connected to the second opening of the pad defining layer, and the groove of the protrusion pattern may be covered by the second barrier layer.

According to an embodiment of the disclosure, a display device ma includes a substrate including a first substrate, a first barrier layer, a second barrier layer, and a second substrate, which are sequentially stacked therein, a thin-film transistor layer, a light emitting element layer, an encapsulation layer, and a touch sensing unit, which are sequentially stacked on the second substrate, and a pad unit disposed in a non-display area of the substrate and including a plurality of pads connected to a driving board disposed on the first substrate. In such an embodiment, each of the pads includes an inorganic layer and a pad electrode, which are sequentially stacked on an inner circumferential surface of a pad contact hole defined through the second substrate and the second barrier layer, a rear pad line disposed on the first barrier layer and connected to the pad electrode through a middle hole defined through the inorganic layer inside the pad contact hole, and a rear pad electrode extending from the rear pad line and connected to the driving board under the substrate through a rear contact hole defined through the first substrate. In such an embodiment, a pad defining layer defined by a patterned portion of the first barrier layer, a laser absorption layer disposed on the second barrier layer to overlap the pad defining layer, and a protrusion pattern covering the pad defining layer from under the substrate are disposed between neighboring rear pad electrodes.

In an embodiment, a plurality of first openings and a second opening disposed between neighboring first openings may be defined through the pad defining layer, and the rear pad electrodes may be disposed in the first openings.

In an embodiment, the laser absorption layer may include a semiconductor layer.

In an embodiment, the semiconductor layer of the laser absorption layer may include amorphous silicon.

In an embodiment, a depth of the protrusion pattern in a thickness direction of the substrate may be lower than a depth of the rear contact hole in the thickness direction of the substrate.

In an embodiment, the protrusion pattern has a tapered tape having a width decreasing as being toward the bottom of the substrate.

In an embodiment, the inorganic layer may be disposed in a same layer as at least one selected from inorganic layers included in the thin-film transistor layer.

In an embodiment, the pad electrode may be disposed in a same layer as a source electrode or a drain electrode of the thin-film transistor layer.

In an embodiment, the pad unit may be disposed in an outermost area of the non-display area in which the encapsulation layer may be not disposed.

However, embodiments of the disclosure are not restricted to the one set forth herein. The above and other features of embodiments of the disclosure will become more apparent to one of ordinary skill in the art to which the disclosure pertains by referencing the detailed description of embodiments of the disclosure given below.

BRIEF DESCRIPTION OF THE DRAWINGS

These and/or other features of embodiments will become apparent and more readily appreciated from the following description of the embodiments, taken in conjunction with the accompanying drawings, in which.

DETAILED DESCRIPTION

Figure 1:
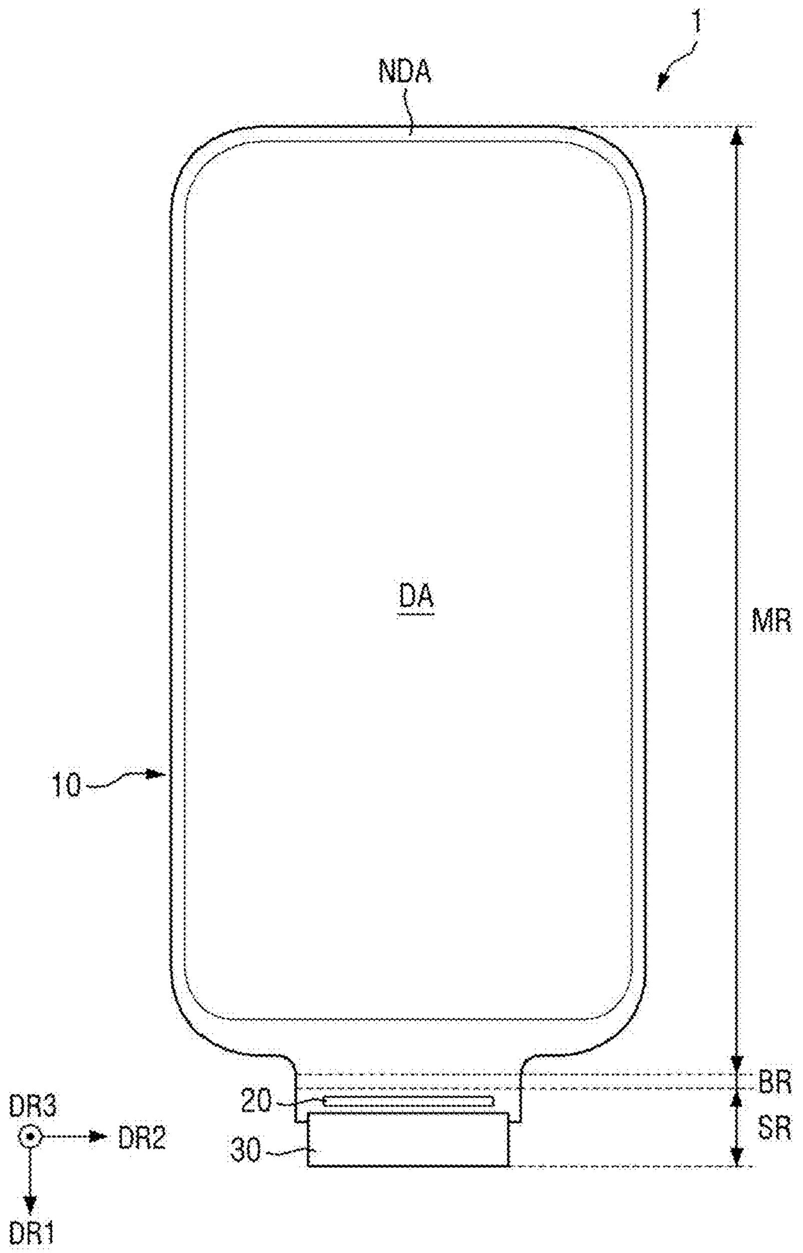
FIG. 1 is a plan view of a display device according to a comparative example.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. Like reference numerals refer to like elements throughout.

It will also be understood that when a layer is referred to as being "on" another layer or substrate, it can be directly on the other layer or substrate, or intervening layers may also be present therebetween. In contrast, when an element is referred to as being "directly on" another element, there are no intervening elements present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Features of each of various embodiments of the disclosure may be partially or entirely combined with each other and may technically variously interwork with each other, and respective embodiments may be implemented independently of each other or may be implemented together in association with each other.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings.

Figure 2:
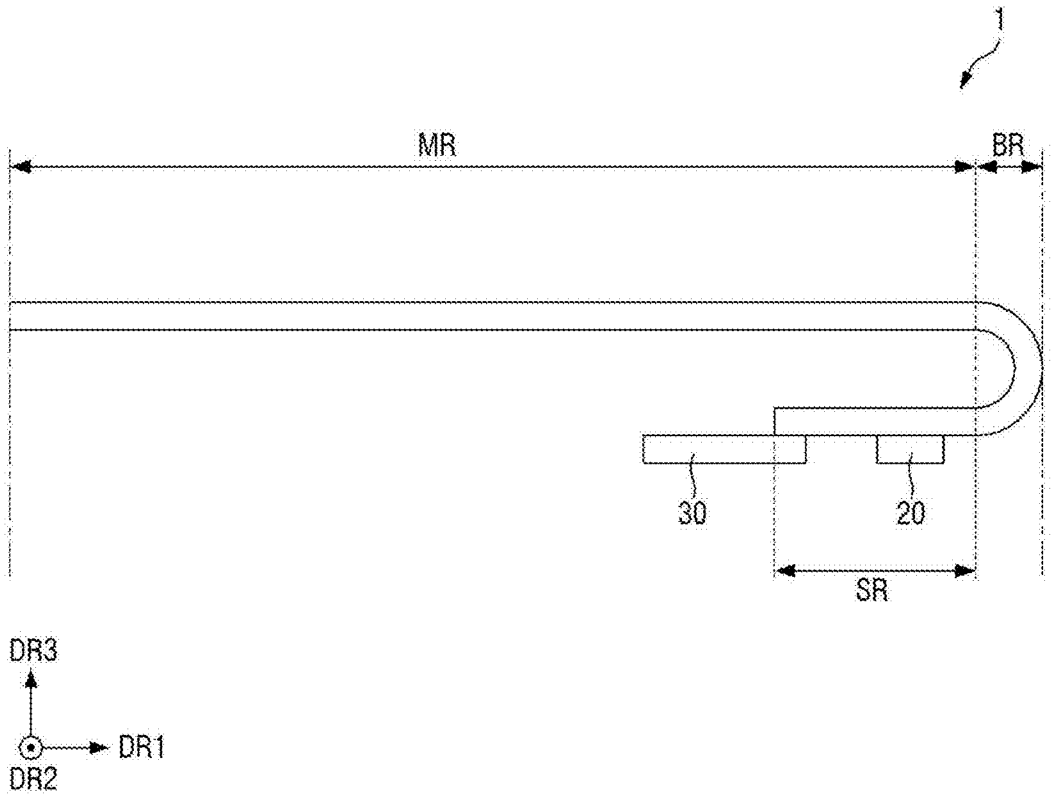
FIG. 2 is a cross-sectional view of the display device according to the comparative example.

FIG. 1 is a plan view of a display device 1 according to a comparative example. FIG. 2 is a cross-sectional view of the display device 1 according to the comparative example.

In the plan view of FIG. 1, up, down, left, and right directions are defined for ease of description. An up-down direction is defined as a first direction DR1 which is a vertical direction or a column direction, a left-right direction is defined as a second direction DR2 which is a horizontal direction or a row direction, and a perpendicular direction is defined as a third direction DR3. The third direction DR3 may be a thickness direction of the display device 1.

Referring to FIGS. 1 and 2, the display device 1 according to the comparative example may include a display panel 10. The display panel 10 may include a substrate SUB including a flexible polymer material such as polyimide. Accordingly, the display panel 10 can be curved, bent, folded, or rolled.

The display panel 10 may include a main area MR, a bending area BR extending from a side of the main area MR, and a sub-area SR extending from a side of the bending area BR. The bending area BR is an area disposed between the main area MR and the sub-area SR and may be bent at a specified curvature. The sub-area SR may overlap the main area MR in a thickness direction (e.g., the third direction DR3) as the bending area BR is bent.

In the display panel 10, a display area DA which displays a screen is disposed within the main area MR. In the display panel 10, a non-display area NDA which does not display a screen may be an area other than the display area DA. The main area MR may have a shape generally similar to the external shape of the display device 1 in plan view. The main area MR may be a flat area located in one plane.

The display area DA of the display panel 10 may be located in the center portion of the main area MR. The display area DA may include a plurality of pixels. The display area DA may have a rectangular shape or a rectangular shape with rounded corners.

The non-display area NDA may be located around the display area DA in the main area MR. The non-display area NDA of the main area MR may lie in an area from the outer boundary of the display area DA to the edge of the display panel 10. Signal lines or driving circuits for transmitting signals to the display area DA may be disposed in the non-display area NDA of the main area MR.

The bending area BR may be connected to an end of the main area MR. A width of the bending area BR may be smaller than a width of the main area MR (a width of each short side). With a curvature, the bending area BR of the display panel 10 may be bent downward in the thickness direction, for example, in a direction opposite to a display surface.

The sub-area SR may extend from an end of the bending area BR in a direction parallel to the main area MR. The sub-area SR may overlap the main area MR in the thickness direction of the display panel 10. The sub-area SR may overlap the non-display area NDA at an edge of the main area MR and may further overlap the display area DA of the main area MR.

According to the comparative example, a driving chip 20 may be disposed on the sub-area SR of the display panel 10. The driving chip 20 may include an integrated circuit which drives the display panel 10. The driving chip 20 may be mounted on the display panel 10 in the sub-area SR.

The driving chip 20 may be attached onto the display panel 10 through an anisotropic conductive film or may be attached onto the display panel 10 through ultrasonic bonding.

A pad unit (not illustrated) may be disposed at an end of the sub-area SR of the display panel 10. The display panel 10 may be connected to a display driving board 30 through the pad unit. The display driving board 30 may be a flexible printed circuit board or film.

A plurality of signal lines may be disposed in the sub-area SR, the bending area BR, and the main area MR. The signal lines may extend from the main area MR to the pad unit of the sub-area SR via the bending area BR.

As described above, in the display device 1 according to the comparative example illustrated in FIGS. 1 and 2, as the bending area BR of the display panel 10 is bent, the sub-area SR, in which the pad unit and the driving chip 20 are disposed, is placed to face downward in the thickness direction. In the display device 1 according to the comparative example, the curvature of the bending area BR may be desired to be increased to reduce a width (i.e., bezel width or dead space width) of the non-display area NDA excluding the display area DA. However, in the comparative example, as the curvature of the bending area BR increases, the possibility of wiring defects also increases. Therefore, there is a limit to reducing the width (i.e., bezel width or dead space width) of the non-display area NDA by increasing the curvature of the bending area BR.

In an embodiment of the disclosure, a display panel 10 does not include a bending area that is bent, and a pad unit 430 is connected to a driving circuit unit such as a driving board 410 through a rear surface of the display panel 10. Therefore, a width (i.e., bezel width or dead space width) of a non-display area NDA can be reduced compared to the comparative example illustrated in FIGS. 1 and 2. A display device 1 according to an embodiment of the disclosure will now be described in detail with reference to FIGS. 3 through 19.

Figure 3:
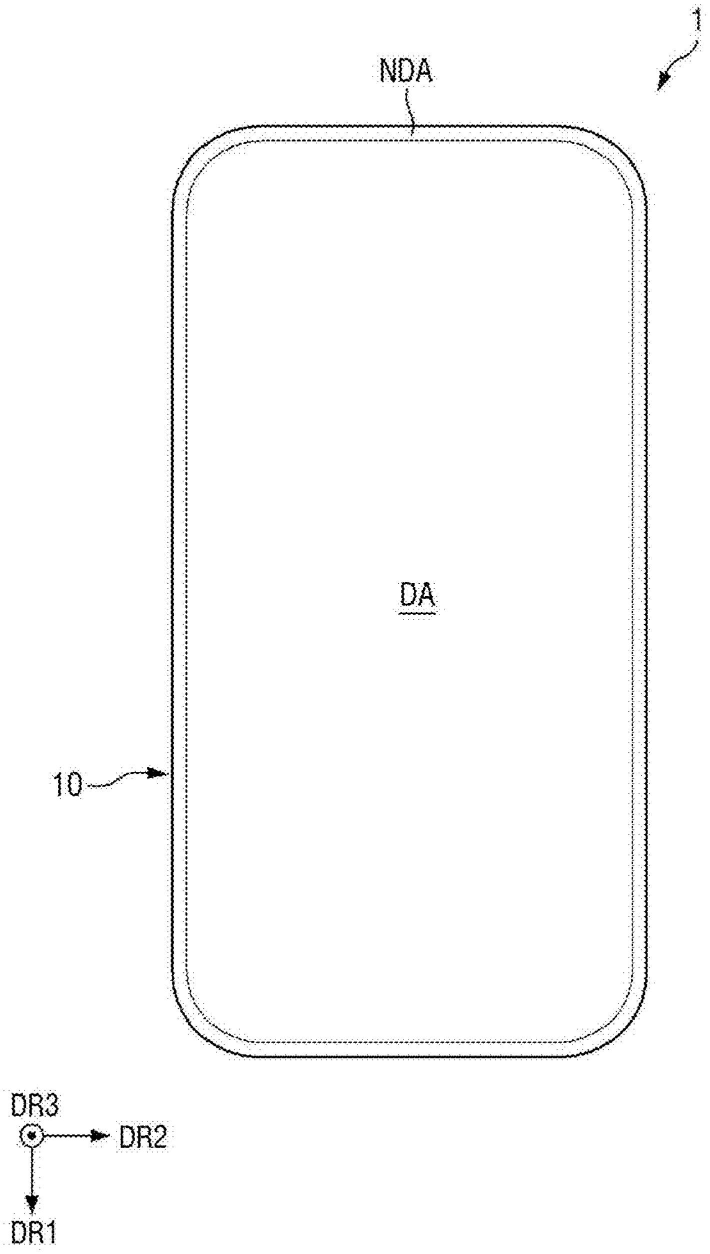
FIG. 3 is a plan view of a display device according to an embodiment.
Figure 4:
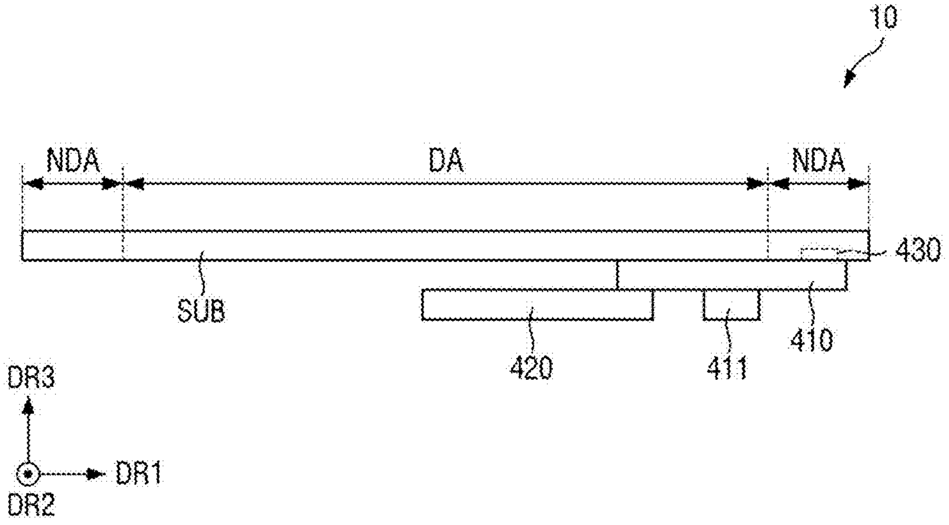
FIG. 4 is a cross-sectional view of the display device according to an embodiment.

FIG. 3 is a plan view of a display device 1 according to an embodiment. FIG. 4 is a cross-sectional view of the display device 1 according to an embodiment.

Referring to FIGS. 3 and 4, an embodiment of the display device 1 may be a device for displaying moving images or still images. The display device 1 may be applied to portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as to various products such as televisions, notebook computers, monitors, billboards and Internet of things (IoT) devices. The display device 1 may be, for example, an organic light emitting display device 1, a liquid crystal display device 1, a plasma display device 1, a field emission display device 1, an electrophoretic display device 1, an electrowetting display device 1, a quantum dot light emitting display device 1, or a micro-light emitting diode display device 1. For convenience of description, embodiments where the display device 1 is an organic light emitting display device 1 will be described below as an example, but embodiments are not limited thereto.

The display device 1 may include a display panel 10. The display panel 10 may include a substrate SUB including a flexible polymer material such as polyimide. Accordingly, the display panel 10 can be curved, bent, folded, or rolled.

The display panel 10 includes a display area DA and a non-display area NDA. The non-display area NDA may be an area other than the display area DA. A pad unit 430 exposed toward a rear surface of the display panel 10 is disposed in the non-display area NDA. The pad unit 430 is exposed through a portion of the rear surface of the display panel 10 which corresponds to the non-display area NDA. The pad unit 430 may be connected to a driving board 410 disposed on (or placed to face) the rear surface of the display panel 10. The pad unit 430 of the display panel 10 may include a pad electrode (e.g., 721 of FIG. 7), and the pad electrode (e.g., 721 of FIG. 7) may be electrically connected to a pad (e.g., a bump) of the driving board 410 by a conductive member such as a conductive ink (e.g., metal ink).

Signal lines or driving circuits for transmitting signals to the display area DA may be disposed in the non-display area NDA. The signal lines may extend from the display area DA to the pad unit 430 via the non-display area NDA.

In an embodiment of the disclosure, a driving chip 411 may be disposed on the driving board 410. The driving chip 411 may include an integrated circuit that drives the display panel 10. In an embodiment, the driving chip 411 may be a chip on plastic (COP)-type integrated circuit. In such an embodiment, the driving board 410 may include a plastic board (or a flexible board) including a flexible polymer material such as polyimide. In an embodiment, the driving chip 411 may be a chip on film (COF)-type integrated circuit. In such an embodiment, the driving board 410 may be a film-type board such as a flexible printed circuit board (FPCB). That is, the driving board 410 of the display device 1 according to an embodiment mentioned herein may be a plastic board (or a flexible board) including a flexible polymer material such as polyimide or may be a film-type board such as an FPCB.

A lead line pad unit (not illustrated) connected to a main board 420 may be disposed at an end of the driving board 410. The driving board 410 may be connected to the main board 420 through the lead line pad unit disposed at the end thereof. A processor (i.e., a host or a controller) which controls the overall operation of the display device 1, a memory, a touch driving circuit, or a power circuit may be disposed on the main board 420.

As described above, in the display device 1 according to an embodiment, the display panel 10 does not include a bending area and is connected to a driving circuit unit such as the driving board 410 through the rear surface thereof. In such an embodiment of the display device 1, a width (i.e., bezel width or dead space width) of the non-display area NDA can be reduced compared to the comparative example illustrated in FIGS. 1 and 2.

Figure 5:
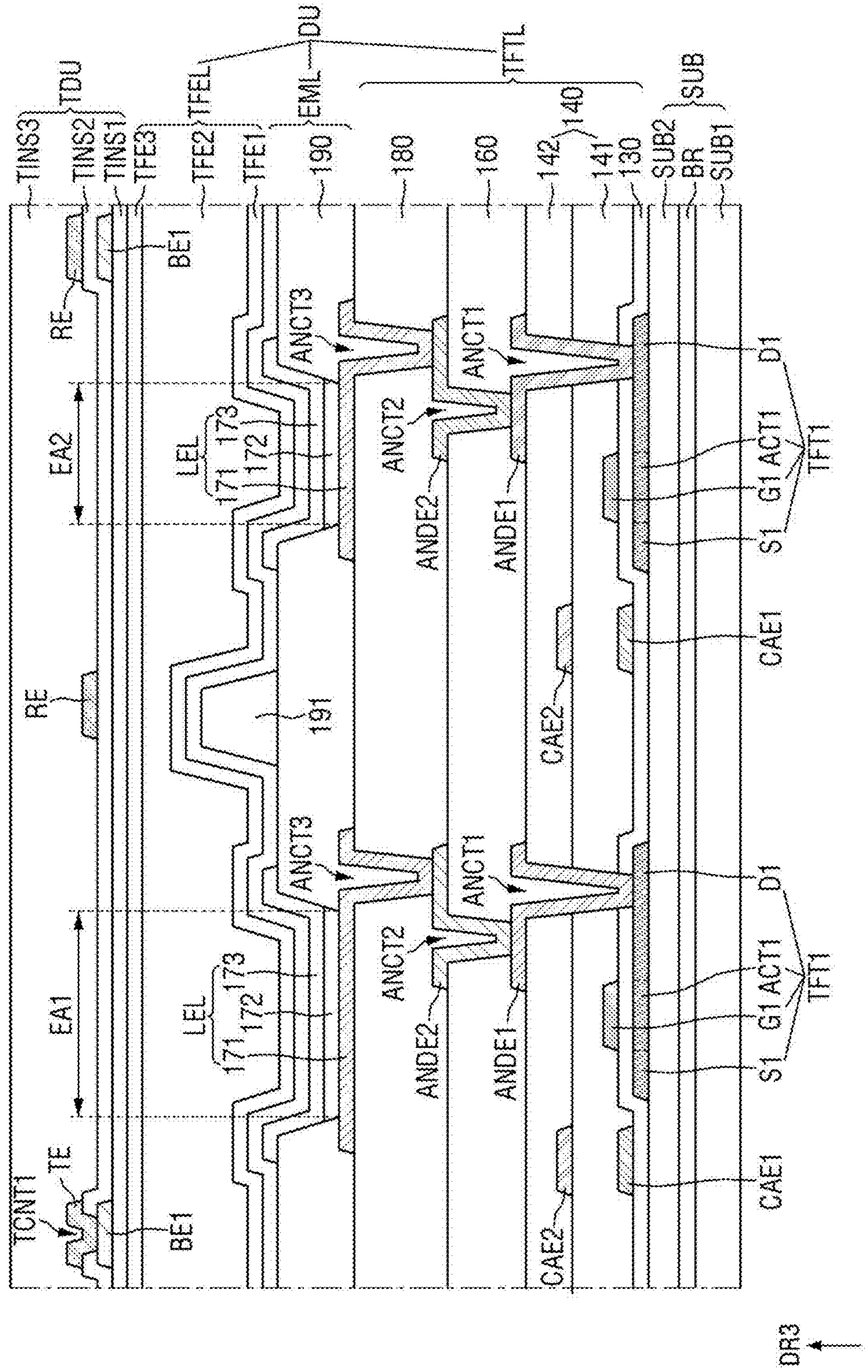
FIG. 5 illustrates the cross-sectional structure of a portion of a display area of a display panel according to an embodiment.

FIG. 5 illustrates the cross-sectional structure of a portion of a display area DA of a display panel 10 according to an embodiment.

In the description of FIG. 5, the expression "on" may refer to the third direction DR3 in which the front of the display panel 10 faces. The front of the display panel 10 may refer to a direction in which light emitting elements included in the display panel 10 emit light to display an image.

Referring to FIG. 5, the display panel 10 uses a flexible plastic substrate as a base substrate. A substrate SUB may include or be made of an insulating material such as polymer resin. In an embodiment, for example, the substrate SUB may include or be made of polyimide. Therefore, the substrate SUB can be bent, folded, rolled, etc. The substrate SUB may include a multilayer including a first substrate SUB1, a second substrate SUB2, and a barrier layer BR disposed between them. In an embodiment, for example, the substrate SUB of the display panel 10 includes the first substrate SUB1, the barrier layer BR disposed on the first substrate SUB1, and the second substrate SUB2 disposed on the barrier layer BR. The first substrate SUB1 and the second substrate SUB2 may include a flexible material such as polyimide.

The barrier layer BR is a layer for protecting transistors of a thin-film transistor layer TFTL and light emitting layers 172 of a light emitting element layer EML from moisture introduced. The barrier layer BR may be defined by or composed of a plurality of inorganic layers stacked alternately. In an embodiment, for example, the barrier layer BR may be a multilayer in which at least one inorganic layer selected from a silicon nitride layer, a silicon oxynitride layer, a silicon oxide layer, a titanium oxide layer, and an aluminum oxide layer are alternately stacked.

The thin-film transistor layer TFTL including thin-film transistors, the light emitting element layer EML including light emitting elements LEL, an encapsulation layer TFEL for encapsulating the light emitting elements LEL, and a touch sensing unit TDU may be sequentially stacked on the second substrate SUB2. Although not illustrated, at least some of the layers illustrated in FIG. 5 may not be disposed in a non-display area NDA of the display panel 10. Since the thin-film transistor layer TFTL, the light emitting element layer EML, and the encapsulation layer TFEL perform functions to display images, the thin-film transistor layer TFTL, the light emitting element layer EML, and the encapsulation layer TFEL may be referred to as, but not limited to, a display unit DU.

Thin-film transistors of a pixel driving circuit for driving each pixel are disposed on the second substrate SUB2. FIG. 5 illustrates only a first thin-film transistors TFT1 among the thin-film transistors of the pixel driving circuits for convenience of illustration. In an embodiment, for example, each of the first thin-film transistors TFT1 may function as a driving transistor in a pixel driving circuit.

Each of the first thin-film transistors TFT1 may include a first active layer ACT1 and a first gate electrode G1. The first active layer ACT1 may include polycrystalline silicon, monocrystalline silicon, low-temperature polycrystalline silicon, amorphous silicon, or an oxide semiconductor.

The first active layer ACT1 may include a first source region S1 and a first drain region D1. A first channel region CHA1 may be a region overlapping the first gate electrode G1 in the third direction DR3 which is the thickness direction of the substrate SUB. The first source region S1 may be disposed on a side of the first active layer ACT1, and the first drain region D1 may be disposed on another side of the first active layer ACT1. The first source region S1 and the first drain region D1 may be regions not overlapped by the first gate electrode G1 in the third direction DR3. The first source region S1 and the first drain region D1 may be regions formed to have conductivity by doping a silicon semiconductor or an oxide semiconductor with ions or impurities.

A gate insulating layer 130 may be disposed on the first active layers ACT1 of the first thin-film transistors TFT1. The gate insulating layer 130 may include or be made of an inorganic layer such as a silicon nitride layer, a silicon oxynitride layer, a silicon oxide layer, a titanium oxide layer, or an aluminum oxide layer.

The first gate electrodes G1 of the first thin-film transistors TFT1 and first capacitor electrodes CAE1 may be disposed on the gate insulating layer 130. The first gate electrodes G1 may overlap the first active layers ACT1 in the third direction DR3. Although the gate electrodes G1 and the first capacitor electrodes CAE1 are spaced apart from each other in FIG. 5, they may also be connected to each other. Each of the gate electrodes G1 and the first capacitor electrodes CAE1 may be a single layer or a multilayer, each layer therein including or made of at least one selected from molybdenum (Mo), aluminum (Al), chromium (Cr), gold (Au), titanium (Ti), nickel (Ni), neodymium (Nd), copper (Cu), and alloys thereof.

Interlayer insulating layers 140 may be disposed on the first gate electrodes G1 of the first thin-film transistors TFT1 and the first capacitor electrodes CAE1. Specifically, a first interlayer insulating layer 141 may be disposed on the first gate electrodes G1 of the first thin-film transistors TFT1 and the first capacitor electrodes CAE1. The first interlayer insulating layer 141 may include or be made of an inorganic layer such as a silicon nitride layer, a silicon oxynitride layer, a silicon oxide layer, a titanium oxide layer, or an aluminum oxide layer. The first interlayer insulating layer 141 may be defined by or composed of a plurality of inorganic layers.

Second capacitor electrodes CAE2 may be disposed on the first interlayer insulating layer 141. The second capacitor electrodes CAE2 may overlap the first capacitor electrodes CAE1 in the third direction DR3. In an embodiment, the first capacitor electrodes CAE1 are connected to the first gate electrodes G1, and the second capacitor electrodes CAE2 may overlap the first gate electrodes G1 in the third direction DR3. Since the first interlayer insulating layer 141 has a predetermined dielectric constant, capacitors may be formed by the first capacitor electrodes CAE1, the second capacitor electrodes CAE2, and the first interlayer insulating layer 141 disposed therebetween. Each of the second capacitor electrodes CAE2 may be a single layer or a multilayer, each layer therein including or made of at least one selected from molybdenum (Mo), aluminum (Al), chromium (Cr), gold (Au), titanium (Ti), nickel (Ni), neodymium (Nd), copper (Cu), and alloys thereof.

A second interlayer insulating layer 142 may be disposed on the second capacitor electrodes CAE2. The second interlayer insulating layer 142 may include or be made of an inorganic layer such as a silicon nitride layer, a silicon oxynitride layer, a silicon oxide layer, a titanium oxide layer, or an aluminum oxide layer. The second interlayer insulating layer 142 may be defined by or composed of a plurality of inorganic layers.

First anode connection electrodes ANDE1 may be disposed on the second interlayer insulating layer 142. The first anode connection electrodes ANDE1 may be connected to the first drain regions D1 of the first thin-film transistors TFT1 through first connection contact holes ANCT1 defined or formed through the gate insulating layer 130, the first interlayer insulating layer 141, and the second interlayer insulating layer 142. Each of the first anode connection electrodes ANDE1 may be a single layer or a multilayer, each layer therein including or made of at least one selected from molybdenum (Mo), aluminum (Al), chromium (Cr), gold (Au), titanium (Ti), nickel (Ni), neodymium (Nd), copper (Cu), and alloys thereof.

A first planarization layer 160 may be disposed on the first anode connection electrodes ANDE1 to flatten steps formed by the first thin-film transistors TFT1. The first planarization layer 160 may include or be made of an organic layer such as acryl resin, epoxy resin, phenolic resin, polyamide resin, or polyimide resin.

Second anode connection electrodes ANDE2 may be disposed on the first planarization layer 160. The second anode connection electrodes ANDE2 may be connected to the first anode connection electrodes ANDE1 through second connection contact holes ANCT2 defined or formed through the first planarization layer 160. Each of the second anode connection electrodes ANDE2 may be a single layer or a multilayer, each layer therein including or made of at least one selected from molybdenum (Mo), aluminum (Al), chromium (Cr), gold (Au), titanium (Ti), nickel (Ni), neodymium (Nd), copper (Cu), and alloys thereof.

A second planarization layer 180 may be disposed on the second anode connection electrodes ANDE2. The second planarization layer 180 may include or be made of an organic layer such as acryl resin, epoxy resin, phenolic resin, polyamide resin, or polyimide resin.

The light emitting elements LEL and a bank 190 may be disposed on the second planarization layer 180. Each of the light emitting elements LEL includes a pixel electrode 171, a light emitting layer 172, and a common electrode 173.

The pixel electrode 171 may be disposed on the second planarization layer 180. The pixel electrode 171 may be connected to each of the second anode connection electrodes ANDE2 through a third connection contact hole ANCT3 defined or formed through the second planarization layer 180.

In an embodiment having a top emission structure in which light is emitted from the light emitting layer 172 toward the common electrode 173, the pixel electrode 171 may include or be made of a metal material having high reflectivity, such as a stacked structure (Ti/Al/Ti) of aluminum and titanium, a stacked structure (ITO/AV/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu).

The bank 190 may be disposed on the second planarization layer 180 to separate the pixel electrodes 171 to define an emission area of each pixel, for example, a light emitting portion. The light emitting portion (e.g., EA1, EA2) is an area in which the pixel electrode 171, the light emitting layer 172, and the common electrode 173 are sequentially stacked so that holes from the pixel electrode 171 and electrons from the common electrode 173 recombine together in the light emitting layer 172 to emit light.

In an embodiment, as shown in FIG. 5, the bank 190 defines a first light emitting portion EA1 of a first pixel and a second light emitting portion EA2 of a second pixel which are adjacent to each other. The bank 190 may cover edges of the pixel electrodes 171. The bank 190 may include or be made of an organic layer such as acryl resin, epoxy resin, phenolic resin, polyamide resin, or polyimide resin. The bank 190 may be referred to as a pixel defining layer (PDL). Although not illustrated, the display panel 10 includes a plurality of pixels including first pixels, second pixels, and third pixels. In an embodiment, for example, each of the first pixels may include a first light emitting portion that emits light of a first color, each of the second pixels may include a second light emitting portion that emits light of a second color, and each of the third pixels may include a third light emitting portion that emits light of a third color. According to an embodiment, the pixels may further include fourth pixels, and each of the fourth pixels may include a fourth light emitting portion that emits light of a fourth color.

The light emitting layer 172 may be disposed on the pixel electrode 171 and the bank 190. The light emitting layer 172 may include an organic material to emit light of a predetermined color. In an embodiment, for example, the light emitting layer 172 includes a hole transporting layer, an organic material layer, and an electron transporting layer.

The common electrode 173 may be disposed on the light emitting layer 172. The common electrode 173 may cover the light emitting layer 172. The common electrode 173 may be a common layer commonly disposed in a first light emitting portion EA1, a second light emitting portion EA2, and a third light emitting portion (not illustrated). A capping layer may be disposed on the common electrode 173.

In an embodiment having the top emission structure, the common electrode 173 may be made of a transparent conductive material (TCO) that can transmit light, such as indium tin oxide (ITO) or indium zinc oxide (IZO), or a semi-transmissive conductive material such as magnesium (Mg), silver (Ag) or an alloy of Mg and Ag. In such an embodiment, the common electrode 173 includes or is made of a semi-transmissive conductive material, such that light output efficiency may be increased by a microcavity effect.

A spacer 191 may be disposed on the bank 190. The spacer 191 may support a mask during a process of manufacturing the light emitting layers 172. The spacer 191 may include or be made of an organic layer such as acryl resin, epoxy resin, phenolic resin, polyamide resin, or polyimide resin.

The encapsulation layer TFEL may be disposed on the common electrodes 173. The encapsulation layer TFEL may include at least one inorganic layer to prevent oxygen or moisture from permeating into the light emitting element layer EML. In addition, the encapsulation layer TFEL may include at least one organic layer to protect the light emitting element layer EML from foreign substances such as dust. In an embodiment, for example, the encapsulation layer TFEL may include a first encapsulating inorganic layer TFE1, an encapsulating organic layer TFE2, and a second encapsulating inorganic layer TFE3.

The first encapsulating inorganic layer TFE1 may be disposed on the common electrodes 173, the encapsulating organic layer TFE2 may be disposed on the first encapsulating inorganic layer TFE1, and the second encapsulating inorganic layer TFE3 may be disposed on the encapsulating organic layer TFE2. Each of the first encapsulating inorganic layer TFE1 and the second encapsulating inorganic layer TFE3 may be a multilayer in which at least one inorganic layer selected from a silicon nitride layer, a silicon oxynitride layer, a silicon oxide layer, a titanium oxide layer, and an aluminum oxide layer are alternately stacked. The encapsulating organic layer TFE2 may be an organic layer including an organic material such as acryl resin, epoxy resin, phenolic resin, polyamide resin, or polyimide resin.

The touch sensing unit TDU may be disposed on the encapsulation layer TFEL. The touch sensing unit TDU may be a mutual capacitive touch sensor or a self-capacitive touch sensor. Although FIG. 5 illustrates an embodiment where the touch sensing unit TDU includes a mutual capacitive touch sensor, the disclosure is not limited thereto. The touch sensing unit TDU includes a first touch insulating layer TINS1, connection electrodes BE1, a second touch insulating layer TINS2, driving electrodes TE, sensing electrodes RE, and a third touch insulating layer TINS3.

The first touch insulating layer TINS1 may include or be made of an inorganic layer such as a silicon nitride layer, a silicon oxynitride layer, a silicon oxide layer, a titanium oxide layer, or an aluminum oxide layer.

The connection electrodes BE1 may be disposed on the first touch insulating layer TINS1. Each of the connection electrodes BE1 may be a single layer or a multilayer, each layer therein including or made of at least one selected from molybdenum (Mo), aluminum (Al), chromium (Cr), gold (Au), titanium (Ti), nickel (Ni), neodymium (Nd), copper (Cu), and alloys thereof.

The second touch insulating layer TINS2 is disposed on the connection electrodes BE1. In an embodiment, the second touch insulating layer TINS2 may include or be made of an inorganic layer such as a silicon nitride layer, a silicon oxynitride layer, a silicon oxide layer, a titanium oxide layer, or an aluminum oxide layer. Alternatively, the second touch insulating layer TINS2 may include or be made of an organic layer such as acryl resin, epoxy resin, phenolic resin, polyamide resin, or polyimide resin.

The driving electrodes TE and the sensing electrodes RE may be disposed on the second touch insulating layer TINS2. Each of the driving electrodes TE and the sensing electrodes RE may be a single layer or a multilayer, each layer therein including or made of at least one selected from molybdenum (Mo), aluminum (Al), chromium (Cr), gold (Au), titanium (Ti), nickel (Ni), neodymium (Nd), copper (Cu), and alloys thereof.

The driving electrodes TE and the sensing electrodes RE may overlap the connection electrodes BE1 in the third direction DR3. Each of the driving electrodes TE may be connected to a connection electrode BE1 through a touch contact hole TCNT1 defined or formed through the second touch insulating layer TINS2.

The third touch insulating layer TINS3 may be disposed on the driving electrodes TE and the sensing electrodes RE. The third touch insulating layer TINS3 may planarize steps formed by the driving electrodes TE, the sensing electrodes RE, and the connection electrodes BE1. The third touch insulating layer TINS3 may include or be made of an organic layer such as acryl resin, epoxy resin, phenolic resin, polyamide resin, or polyimide resin.

Figure 6A:
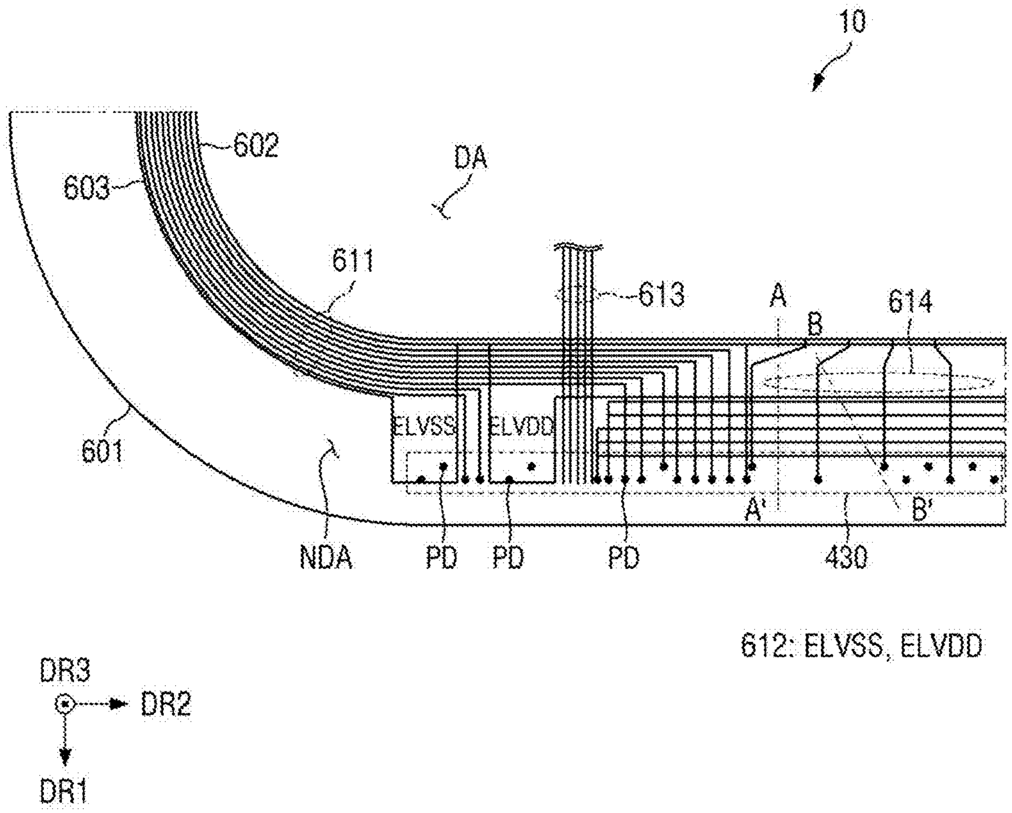
FIG. 6A is a front plan view of a portion of a non-display area of the display panel according to an embodiment.
Figure 6B:
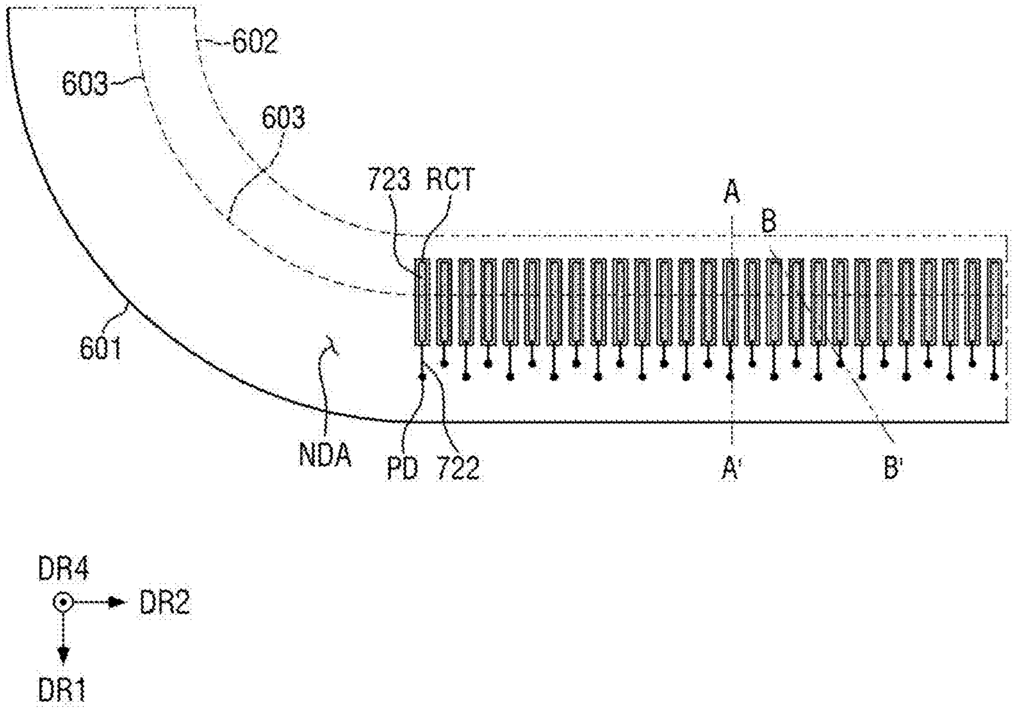
FIGS. 6B and 6C are rear plan views of a portion of the non-display area of the display panel according to an embodiment.
Figure 6C:
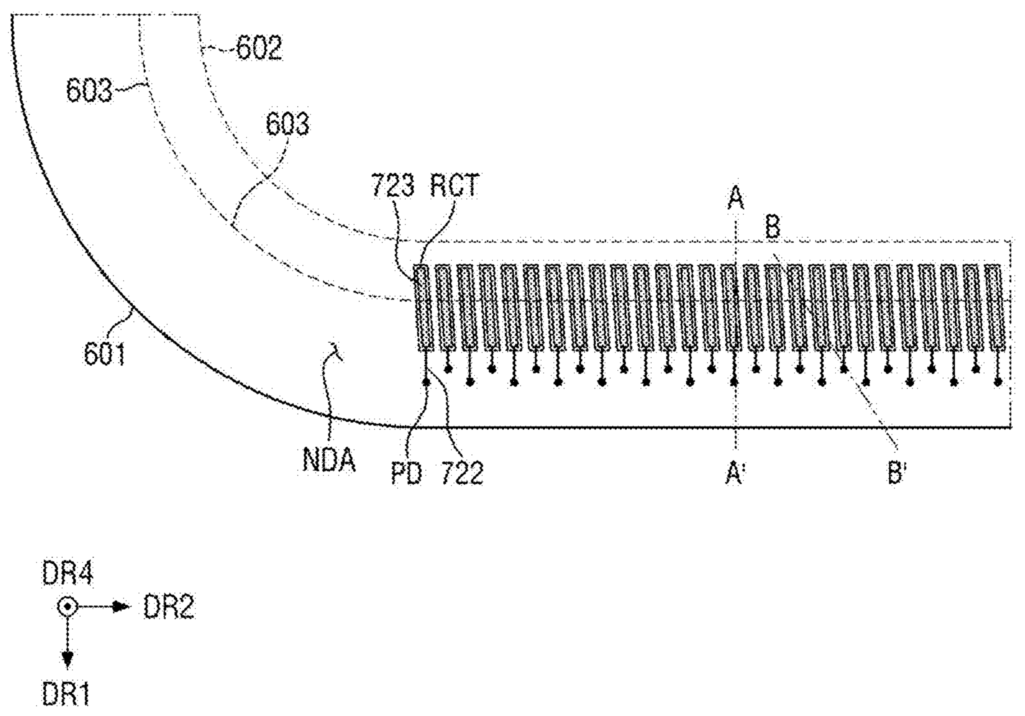

FIG. 6A is a front plan view of a portion of the non-display area NDA of the display panel 10 according to an embodiment. FIGS. 6B and 6C are rear plan views of a portion of the non-display area NDA of the display panel 10 according to an embodiment. For example, FIG. 6A may be an example of the non-display area NDA around a pad unit 430 seen in the third direction DR3 of FIG. 4. For example, FIGS. 6B and 6C may be examples of the non-display area NDA around the pad unit 430 seen in a fourth direction DR4 which is opposite to the third direction DR3 of FIG. 4.

Referring to FIG. 6A, signal lines 611 and power lines 612 for driving pixels of the display area DA may be disposed in the non-display area NDA of the display panel 10 according to an embodiment. In addition, touch connection lines 613 for driving the touch sensing unit may be disposed in the non-display area NDA. The touch connection lines 613 may be lines connected to touch electrodes (e.g., TE and RE in FIG. 5) of the display area DA. The signal lines 611, the power lines 612 and the touch connection lines 613 may extend to the pad unit 430, and the pad unit 430 may be connected to a driving circuit unit such as the driving board 410 through a rear surface of the display panel 10.

According to an embodiment, electrostatic lines 614 for preventing static electricity may be further disposed in the non-display area NDA. The electrostatic lines 614 may extend to the pad unit 430.

In an embodiment, the pad unit 430 of the display panel 10 includes a plurality of pads PD connected to the driving board 410 through the rear surface of the display panel 10. The pads PD include signal pads electrically connected to the signal lines 611, power pads electrically connected to the power lines 612, electrostatic pads electrically connected to the electrostatic lines 614, and touch driving pads electrically connected to the touch connection lines 613.

According to an embodiment, the signal lines 611 may include gate fan-out lines connected to gate lines of the display area DA, data fan-out lines connected to data lines of the display area DA, or emission fan-out lines connected to emission signal lines of the display area DA. The signal lines 611 may be disposed in or (directly on) a same layer as the first anode connection electrodes ANDE1 or the second anode connection electrodes ANDE2 of the display area DA.

According to an embodiment, the power lines 612 may be lines that supply driving power to the pixels of the display area DA and may include a high-potential voltage supply line ELVDD and a low-potential voltage supply line ELVSS. The power lines 612 may be disposed in or (directly on) a same layer as the first anode connection electrodes ANDE1 or the second anode connection electrodes ANDE2 of the display area DA.

Referring to FIGS. 6B and 6C, when the display panel 10 is seen from the back (i.e., in the fourth direction DR4), a plurality of rear contact holes RCT are defined or formed in the non-display area NDA.

Each of the rear contact holes RCT may be formed by etching a portion of the first substrate SUB1 at the bottom (or a bottom surface) of the substrate SUB in which the first substrate SUB1, a first barrier layer BR1, a second barrier layer BR2, and the second substrate SUB2 are sequentially stacked. In an embodiment, for example, each of the rear contact holes RCT may be a region from which the first substrate SUB1 has been removed in the substrate SUB in which the first substrate SUB1, the first barrier layer BR1, the second barrier layer BR2, and the second substrate SUB2 are sequentially stacked.

A rear pad electrode 723 electrically connected to the pad unit 430 is disposed in each of the rear contact holes RCT. In an embodiment, for example, the rear pad electrodes 723 are exposed toward the rear surface of the display panel 10 (i.e., in the fourth direction DR4) through the rear contact holes RCT. The rear pad electrodes 723 are electrically connected to the pads PD of the pad unit 430 through rear pad lines 722. In an embodiment, for example, the rear pad electrodes 723 and the pads PD may be connected one-to-one to each other.

The rear pad electrodes 723 exposed through the rear contact holes RCT are bonded to the driving board 410, as will be described later with reference to FIGS. 7 and 8. Therefore, the driving board 410 may be electrically connected to the pads PD of the pad unit 430 through the rear pad electrodes 723 from the back of the display panel 10 (i.e., in the fourth direction DR4).

According to an embodiment, as illustrated in FIG. 6B, each of the rear pad electrodes 723 may extend in a longitudinal direction of the display panel 10, for example, in the first direction DR1. In addition, the rear pad electrodes 723 may be arranged at intervals in a width direction of the display panel 10, for example, in the second direction DR2. According to an embodiment, as illustrated in FIG. 6C, each of the rear pad electrodes 723 may extend in a diagonal direction inclined at a specified angle from the longitudinal direction of the display panel 10, for example, the first direction DR1. In addition, the rear pad electrodes 723 may be arranged at intervals in the width direction of the display panel 10, for example, in the second direction DR2. The direction in which each of the rear pad electrodes 723 extends is not limited to the illustrated example in FIG. 6C and may also be changed to various directions.

In FIGS. 6B and 6C, a length and width of each of the rear pad electrodes 723 are not limited to the illustrated example and may also be changed to various lengths and widths.

In FIGS. 6A through 6C, a solid line 601 indicates a boundary of the display panel 10 which corresponds to any one corner of the display panel 10. In FIGS. 6A through 6C, a dotted line 602 is an imaginary line indicating a boundary between the non-display area NDA and the display area DA of the display panel 10. In FIGS. 6A through 6C, a dotted line 603 is a line indicating a boundary to which the inorganic layers TFE1 and TFE3 (see FIG. 5) of the encapsulation layer TFEL of the display panel 10 are disposed. As illustrated, the signal lines 611 and the power lines 612 for driving the pixels of the display area DA may be located inside the boundary to which the inorganic layers TFE1 and TFE3 (see FIG. 5) of the encapsulation layer TFEL are disposed and may extend to the pad unit 430 along the non-display area NDA. That is, the signal lines 611 and the power lines 612 for driving the pixels of the display area DA are not disposed outside an inorganic encapsulation area where the inorganic layers TFE1 and TFE3 (see FIG. 5) of the encapsulation layer TFEL are disposed.

Figure 7:
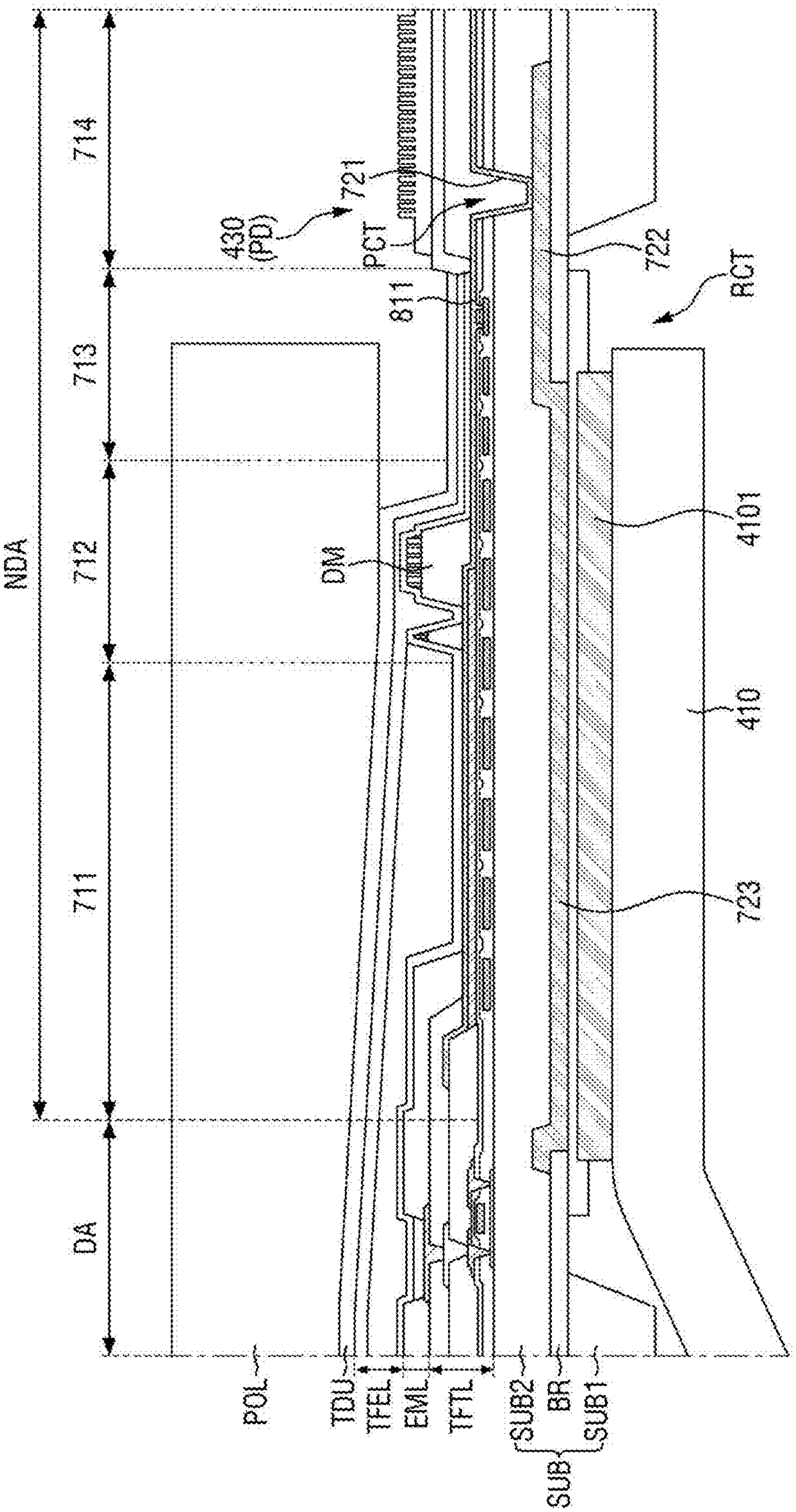
FIG. 7 illustrates the cross-sectional structure of a portion of the non-display area of the display panel according to an embodiment.

FIG. 7 illustrates the cross-sectional structure of a portion of the non-display area NDA of the display panel 10 according to an embodiment. FIG. 8 is a cross-sectional view of a portion of the display panel 10, specifically illustrating the pad unit 430 of FIG. 7. For example, FIG. 7 is a cross-sectional view of the non-display area NDA of the display panel 10 taken along line A-A' of FIGS. 6A through 6C. FIG. 8 is a cross-sectional view of the non-display area NDA of the display panel 10 taken along line B-B' of FIGS. 6A through 6C.

Figure 8:
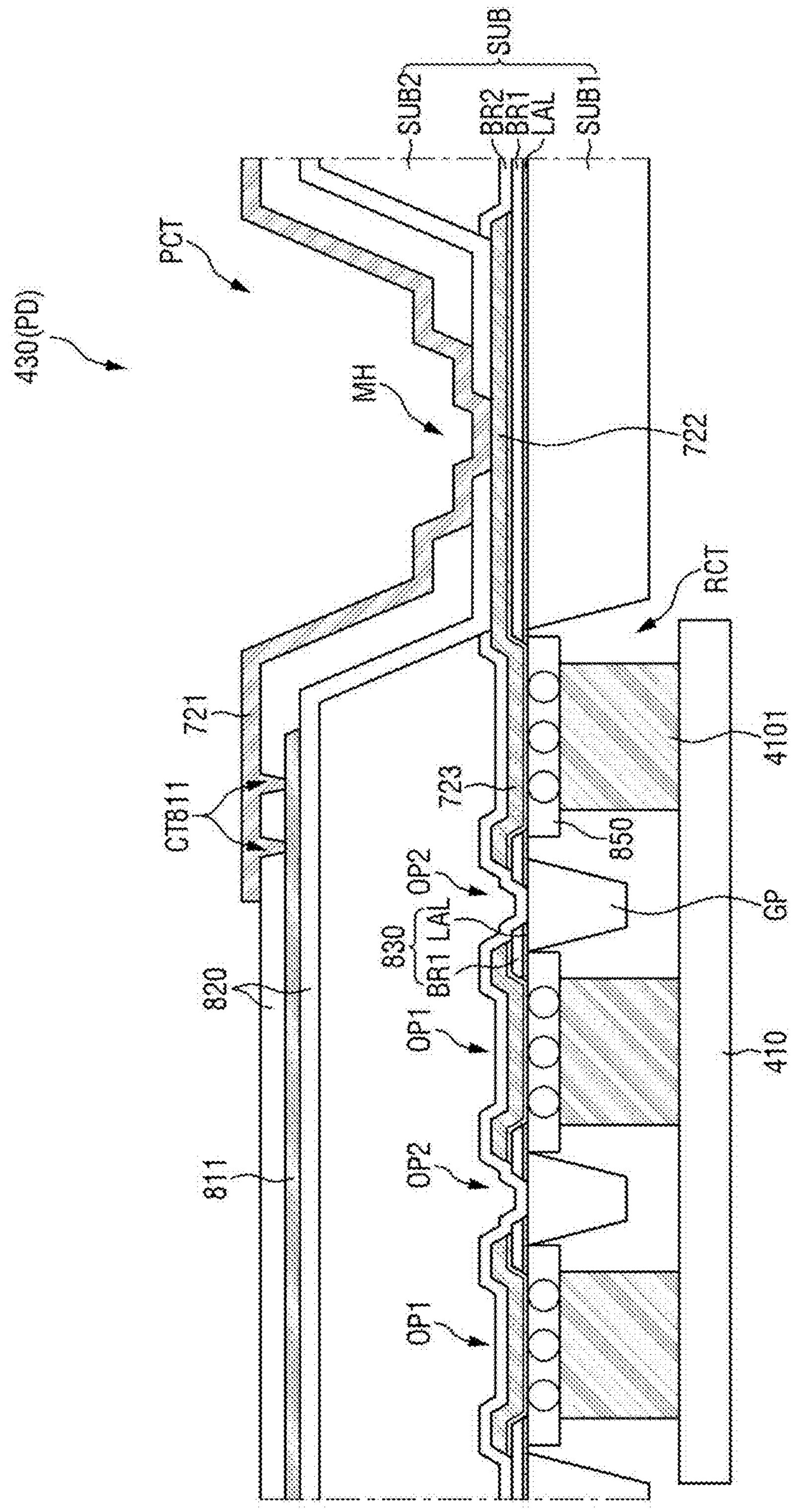
FIG. 8 is a cross-sectional view of a portion of the display panel, specifically illustrating a pad unit of FIG. 7.

Referring to FIGS. 7 and 8, the display panel 10 according to an embodiment may include the substrate SUB, and the substrate SUB may be a flexible substrate in which the first substrate SUB1, the barrier layer BR and the second substrate SUB2 are sequentially stacked. In an embodiment, the barrier layer BR may include the first barrier layer BR1 and the second barrier layer BR2 as illustrated in FIG. 8.

According to an embodiment, the display panel 10 includes the display area DA and the non-display area NDA. In such an embodiment, the substrate SUB may also be divided into the display area DA and the non-display area NDA.

In the display area DA, the thin-film transistor layer TFTL, the light emitting element layer EML, the encapsulation layer TFEL, and the touch sensing unit TDU are sequentially disposed as described above with reference to FIG. 5. In an embodiment, a polarizing layer POL may be further disposed on the touch sensing unit TDU.

The non-display area NDA may include a fan-out wiring area 711 in which the signal lines 611 and the power lines 612 are disposed, a dam area 712 located outside the fan-out wiring area 711 and including at least one dam DM, an inorganic encapsulation area 713 in which only inorganic encapsulation layers are formed, and an outermost area 714 located outside the inorganic encapsulation area 713.

According to an embodiment, the pad unit 430 may be disposed or defined in the outermost area 714. The signal lines 611 and the power lines 612 disposed in the fan-out wiring area 711 may extend to the pad unit 430 disposed in the outermost area 714 via the dam area 712 and the inorganic encapsulation area 713. Since an encapsulation layer is not formed in the outermost area 714 of the non-display area NDA, the outermost area 714 may be referred to as, but not limited to, an "unencapsulated area".

The outermost area 714 is an area where the encapsulation layer TFEL and the polarizing layer POL are not disposed, and the pad unit 430 may be disposed. The pad unit 430 may be electrically connected to the driving board 410 located on the back (or a rear surface) of the display panel 10 through the rear pad lines 722 and the rear pad electrodes 723 disposed in or built into the display panel 10.

The characteristics of the pad unit 430 will now be described in greater detail with reference to FIG. 8.

Referring to FIG. 8, in an embodiment, each of the pads PD included in the pad unit 430 includes inorganic layers 820 and a pad electrode 721, sequentially stacked on an inner circumferential surface of a pad contact hole PCT, which is defined through (e.g., formed by etching) the second substrate SUB2 and the second barrier layer BR2. Each of the inorganic layers 820 covering the inner circumferential surface of the pad contact hole PCT may be formed by a same process as a corresponding one of the inorganic layers (e.g., 130 and 140 in FIG. 5) included in the thin-film transistor layer TFTL. That is, the inorganic layers 820 covering the inner circumferential surface of the pad contact hole PCT may be disposed in or (directly on) a same layer as at least one selected from the inorganic layers (e.g., 130 and 140 in FIG. 5) included in the thin-film transistor layer TFTL. In an embodiment, the pad electrode 721 covering the inorganic layers 820 in the pad contact hole PCT may be formed by a same process as a source electrode or a drain electrode of a thin-film transistor (e.g., the first thin-film transistor TFT1 in FIG. 5) included in the thin-film transistor layer TFTL. That is, the pad electrode 721 covering the inorganic layers 820 in the pad contact hole PCT may be disposed in or (directly on) a same layer as the source electrode or the drain electrode of the thin-film transistor included in the thin-film transistor layer TFTL. In another embodiment, for example, the pad electrode 721 may be formed by a same process as the first anode connection electrodes ANDE1 or the second anode connection electrodes ANDE2 described with reference to FIG. 5.

According to an embodiment, the pad electrode 721 may be connected to a pad connection line 811 extending from the fan-out wiring area 711 to near the pad unit 430. The pad connection line 811 may be, for example, a line disposed in or (directly on) a same layer as a gate electrode (e.g., G1 in FIG. 5) of the thin-film transistor included in the thin-film transistor layer TFTL. The pad connection line 811 may be electrically connected to an end of the pad electrode 721 through contact holes CT811 penetrating an inorganic layer 820. In an embodiment, for example, the pad connection line 811 is a line disposed in or (directly on) a same layer as the gate electrode. However, the disclosure is not limited thereto. In another embodiment, for example, the pad connection line 811 may be disposed in or (directly on) a same layer as the source electrode or the drain electrode of the thin-film transistor included in the thin-film transistor layer TFTL.

According to an embodiment, each of the pads PD further includes a rear pad line 722 and a rear pad electrode 723 which are connected to the pad electrode 721 and built into the display panel 10. The rear pad line 722 and the rear pad electrode 723 may be disposed in or (directly on) a same layer as each other. Each of the rear pad line 722 and the rear pad electrode 723 may be a single layer or a multilayer, each layer therein including or made of at least one selected from molybdenum (Mo), aluminum (Al), chromium (Cr), gold (Au), titanium (Ti), nickel (Ni), neodymium (Nd), copper (Cu), and alloys thereof.

A portion of each inorganic layer 820 covering the inner circumferential surface of the pad contact hole PCT is removed from a bottom surface of the pad contact hole PCT to form a middle hole MH. In an embodiment, for example, the middle hole MH may be defined in the center of the pad contact hole PCT. A width of the middle hole MH may be smaller than a width of the pad contact hole PCT. According to an embodiment, the rear pad line 722 may be exposed during the process of forming the middle hole MH, and the pad electrode 721 may be placed to cover and to contact the rear pad line 722 exposed through the middle hole MH. The rear pad line 722 may extend to the rear pad electrode 723. The rear pad electrode 723 may be connected to the driving board 410 under the substrate SUB through a rear contact hole RCT defined or formed through (e.g., by etching) the first substrate SUB1. Therefore, the pad electrode 721 disposed in the pad contact hole PCT may be electrically connected to a pad 4101 of the driving board 410 via the rear pad line 722 and the rear pad electrode 723.

According to an embodiment, each of the pads PD further includes a protrusion pattern GP disposed between rear contact holes RCT and a pad defining layer 830 covered by the protrusion pattern GP. The protrusion pattern GP and the pad defining layer 830 may effectively prevent undesired damage to the second substrate SUB2 and lifting of the barrier layer BR from the second substrate SUB2 during a process of forming the rear contact holes RCT and a process of bonding the driving board 410.

In an embodiment, the process of forming the rear contact holes RCT may include a process of etching the first substrate SUB1 using ultraviolet laser light. In an embodiment, for example, the laser light may be radiated from under the substrate SUB in which the first substrate SUB1, the first barrier layer BR1, the second barrier layer BR2 and the second substrate SUB2 are sequentially stacked, and a portion of the first substrate SUB1 irradiated with the laser light may be etched. However, a portion of the laser light may damage the second substrate SUB2 by passing through an area between neighboring rear pad electrodes 723 or may damage a signal line (e.g., the pad connection line 811) disposed on the second substrate SUB2.

In an embodiment, the process of bonding the driving board 410 may include a process of bonding pads of the driving board 410 to the rear pad electrodes 723 using metal ink or anisotropic conductive films 850. The bonding process using the anisotropic conductive films 850 may include a photo-curing process using infrared laser light, and undesired damage to the second substrate SUB2 may occur during the photo-curing process.

In an embodiment of the disclosure, the pad unit 430 includes the protrusion patterns GP and the pad defining layer 830 to prevent undesired damage to the second substrate SUB2 and lifting of the barrier layer from the second substrate SUB2 during the process of forming the rear contact holes RCT and the process of bonding the driving board 410.

According to an embodiment, the pad defining layer 830 is disposed to separate a plurality of rear pad electrodes 723 from each other. In an embodiment, for example, the pad defining layer 830 is disposed between neighboring rear pad electrodes 723. The pad defining layer 830 includes a laser absorption layer LAL disposed on the first substrate SUB1 and the first barrier layer BR1 disposed on the laser absorption layer LAL. The pad defining layer 830 defines or is provided with a plurality of first openings OP1 and a second opening OP2 disposed between neighboring first openings OP1. The rear pad electrodes 723 are disposed in the first openings OP1 of the pad defining layer 830. The second openings OP2 of the pad defining layer 830 are aligned with the protrusion patterns GP.

According to an embodiment, the laser absorption layer LAL included in the pad defining layer 830 may be disconnected in the second openings OP2. The laser absorption layer LAL is disconnected to prevent a short circuit between neighboring rear pad electrodes 723. In an embodiment, the laser absorption layer LAL may include a semiconductor layer, and the semiconductor layer may include amorphous silicon. The laser absorption layer LAL including amorphous silicon may change to polysilicon as the laser absorption layer LAL absorbs ultraviolet laser light. Therefore, amorphous silicon included in the laser absorption layer LAL may be changed to polysilicon by ultraviolet laser light during a process of etching the first substrate SUB1 to form the rear pad contact hole PCT. Since polysilicon has higher electrical conductivity than amorphous silicon, the laser absorption layer LAL disposed between neighboring rear pad electrodes 723 may be desired to be disconnected. Therefore, the laser absorption layer LAL may be disconnected in the second openings OP2 of the pad defining layer 830, and the second openings OP2 may be covered by the second barrier layer BR2.

According to an embodiment, the protrusion patterns GP may be patterns remaining after a portion of the first substrate SUB1 is etched to expose the rear pad electrodes 723. A height (or depth) of the protrusion patterns GP may be lower than a height of the rear contact holes RCT. That is, the height of the protrusion patterns GP along the thickness direction of the substrate SUB may be lower than the height of the rear contact holes RCT.

According to an embodiment, the protrusion patterns GP may have a tapered shape having a width decreasing as being toward the bottom (or a bottom surface) of the substrate SUB. However, the disclosure may not be limited to the tapered shape of the protrusion patterns GP. In an embodiment, for example, the shape of the protrusion patterns GP may also be changed as will be described with reference to FIGS. 16 through 19.

Figure 9:
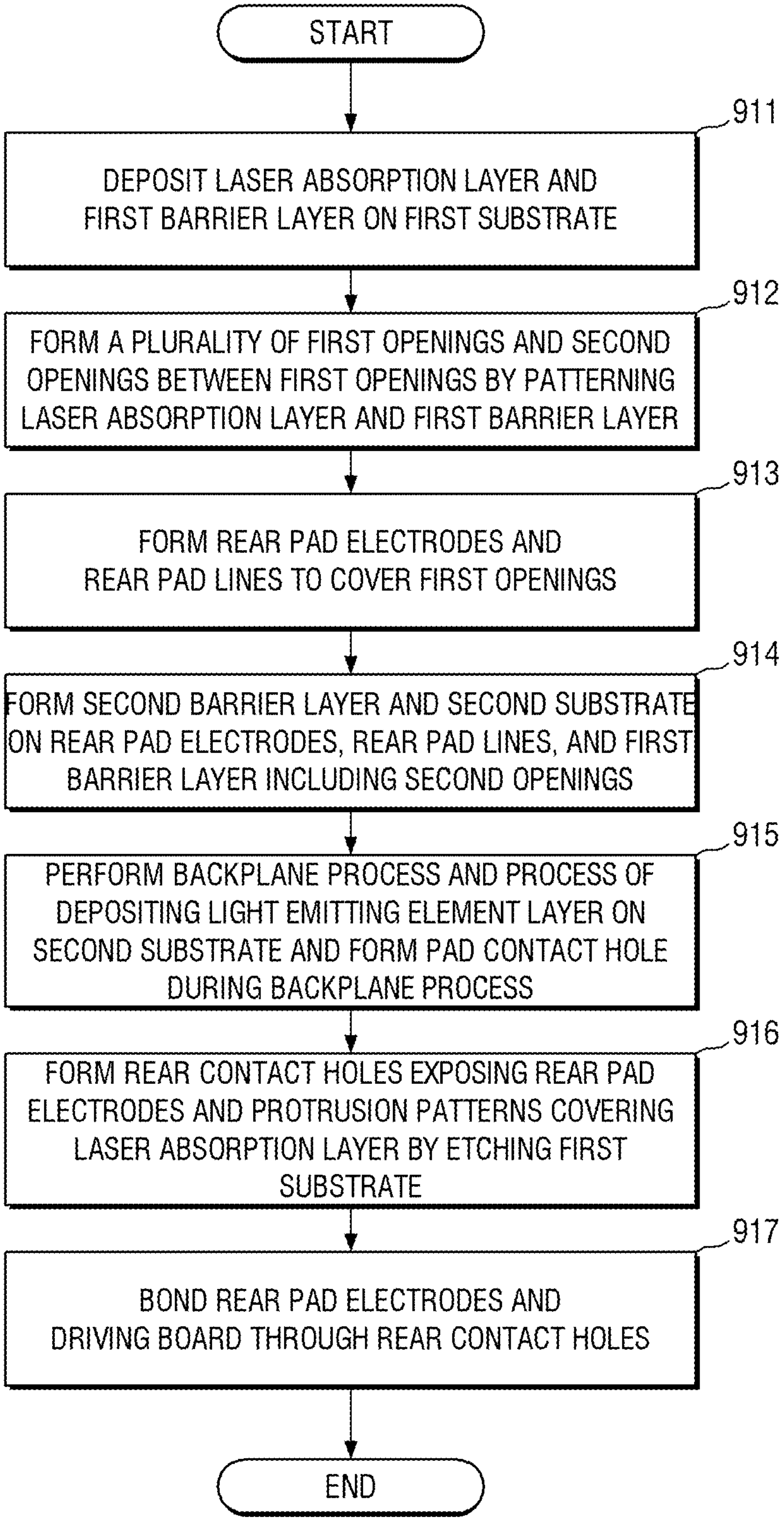
FIG. 9 is a flowchart illustrating a method of manufacturing a display device according to an embodiment.

FIG. 9 is a flowchart illustrating a method of manufacturing a display device according to an embodiment. FIGS. 10 through 15 are process cross-sectional views illustrating the method of manufacturing the display device according to an embodiment.

At least some of the operations of the manufacturing process illustrated in FIG. 9 may be omitted. A process of manufacturing a display device 1 described herein or known in the art may be additionally performed before or after each of the operations of the manufacturing process illustrated in FIG. 9.

The method of manufacturing the display device 1 according to an embodiment will now be described with reference to FIGS. 9 through 15.

Referring to FIG. 9, in an embodiment of the method of manufacturing the display device 1, a laser absorption layer LAL and a first barrier layer BR1 may be deposited on a first substrate SUB1 (operation 911). The first substrate SUB1 may include a flexible material such as polyimide. The laser absorption layer LAL may be a semiconductor layer including amorphous silicon. The first barrier layer BR1 may be an inorganic layer including at least one selected from a silicon nitride layer, a silicon oxynitride layer, a silicon oxide layer, a titanium oxide layer, and an aluminum oxide layer.

Figure 10:
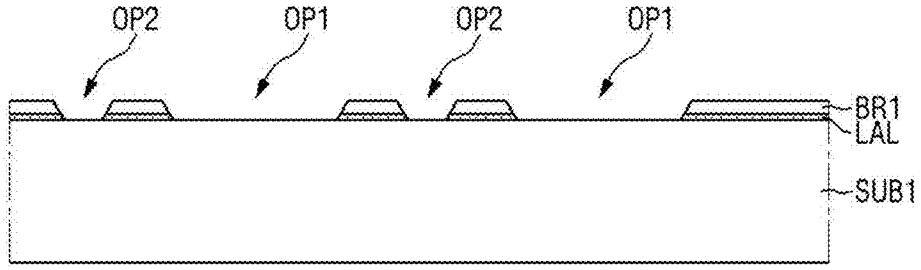
FIGS. 10 through 15 are process cross-sectional views illustrating the method of manufacturing the display device according to an embodiment.

Referring to FIGS. 9 and 10, in an embodiment of the method of manufacturing the display device 1, the laser absorption layer LAL and the first barrier layer BR1 may be patterned to form a plurality of first openings OP1 and second openings OP2 between the first openings OP1 (operation 912). Accordingly, a pad defining layer 830 including the laser absorption layer LAL and the first barrier layer BR1 may be formed. The pad defining layer 830 may define the first openings OP1 and the second openings OP2. The pad defining layer 830 may be disconnected in the second openings OP2.

Figure 11:
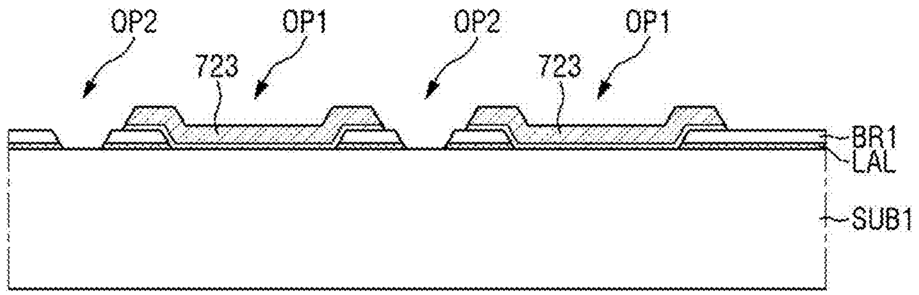

Referring to FIGS. 9 and 11, in an embodiment of the method of manufacturing the display device 1, rear pad electrodes 723 and rear pad lines 722 may be formed to cover the first openings OP1 (operation 913). In an embodiment, for example, a metal layer may be deposited on the first substrate SUB1 including the pad defining layer 830 and may be partially etched. Accordingly, the rear pad electrodes 723 may be placed to cover the first openings OP1 of the pad defining layer 830 and the pad defining layer 830 adjacent to the first openings OP1, and the rear pad lines 722 may extend from the rear pad electrodes 723.

Figure 12:
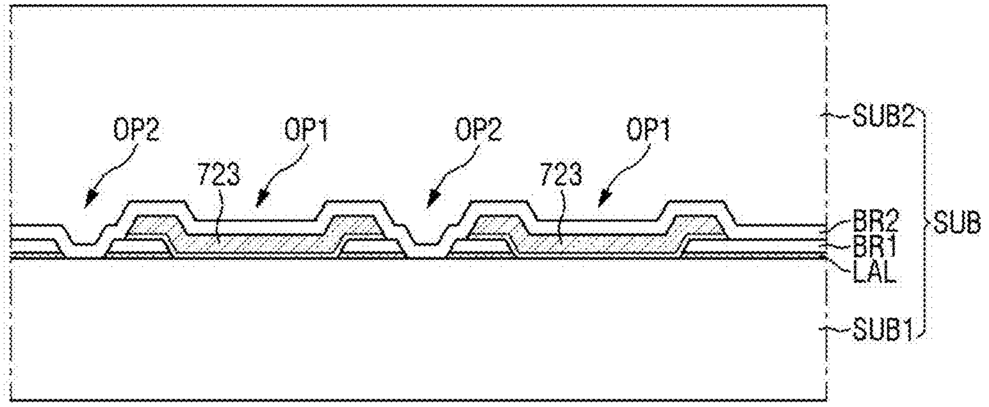

Referring to FIGS. 9 and 12, in an embodiment of the method of manufacturing the display device 1, a second barrier layer BR2 and a second substrate SUB2 may be formed on the rear pad electrodes 723, the rear pad lines 722, and the first barrier layer BR1 provided with the second openings OP2 (operation 914). The second barrier layer BR2 may be an inorganic layer including at least one selected from a silicon nitride layer, a silicon oxynitride layer, a silicon oxide layer, a titanium oxide layer, and an aluminum oxide layer. The second substrate SUB2 may include a flexible material such as polyimide.

Figure 13:
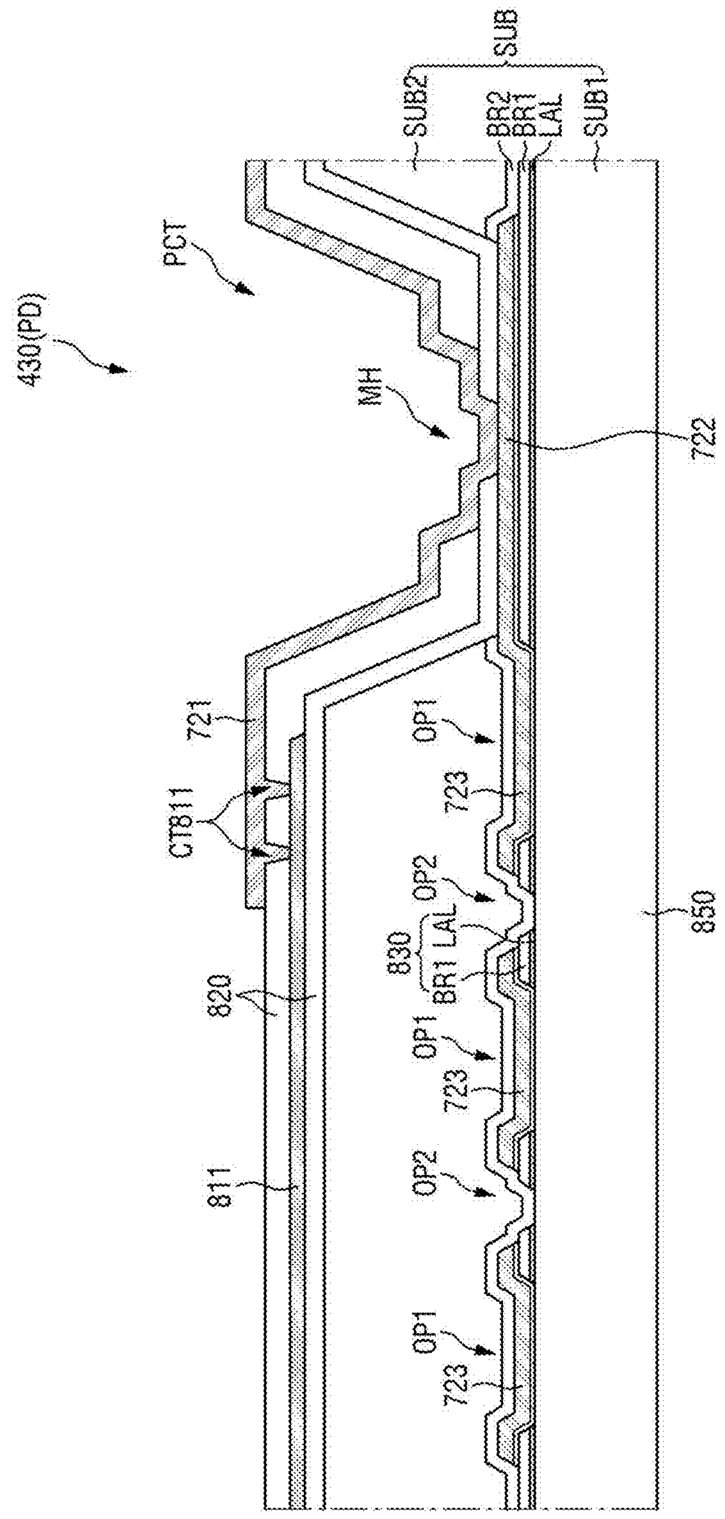

Referring to FIGS. 9 and 13, in an embodiment of the method of manufacturing the display device 1, a backplane process and a process of depositing a light emitting element layer EML may be performed on the second substrate SUB2, and a pad contact hole PCT may be formed during the backplane process (operation 915). The process of forming the pad contact hole PCT may also be performed before the backplane process. The process of forming the pad contact hole PCT may be as follows. A patterned hard mask (not illustrated) may be formed on the second substrate SUB2, and the pad contact hole PCT of a pad unit 430 may be formed in a portion of a non-display area NDA using the hard mask as an etch mask. The backplane process may be a process of forming a thin-film transistor layer TFTL. In the backplane process, signal lines 611, power lines 612, and a pad electrode 721 for driving pixels of a display area may be formed. In addition, in the backplane process, inorganic layers 820, which cover an inner circumferential surface of the pad contact hole PCT, and a middle hole MH, in which a portion of each inorganic layer 820 is etched, may be formed.

According to an embodiment, the pad electrode 721 may be connected to a pad connection line 811 extending from a fan-out wiring area 711 to near the pad unit 430. The pad connection line 811 may be, for example, a line disposed in or (directly on) a same layer as a gate electrode of a thin-film transistor included in the thin-film transistor layer TFTL. The pad connection line 811 may be electrically connected to an end of the pad electrode 721 through contact holes formed through an inorganic layer 820. In the illustrated example, the pad connection line 811 is a line disposed in or (directly on) a same layer as the gate electrode. However, the disclosure is not limited thereto. For example, the pad connection line 811 may also be disposed in or (directly on) a same layer as a source electrode or a drain electrode of the thin-film transistor included in the thin-film transistor layer TFTL.

According to an embodiment, the pad electrode 721 may be formed to cover a rear pad line 722 exposed through the middle hole MH during the backplane process.

Figure 14:
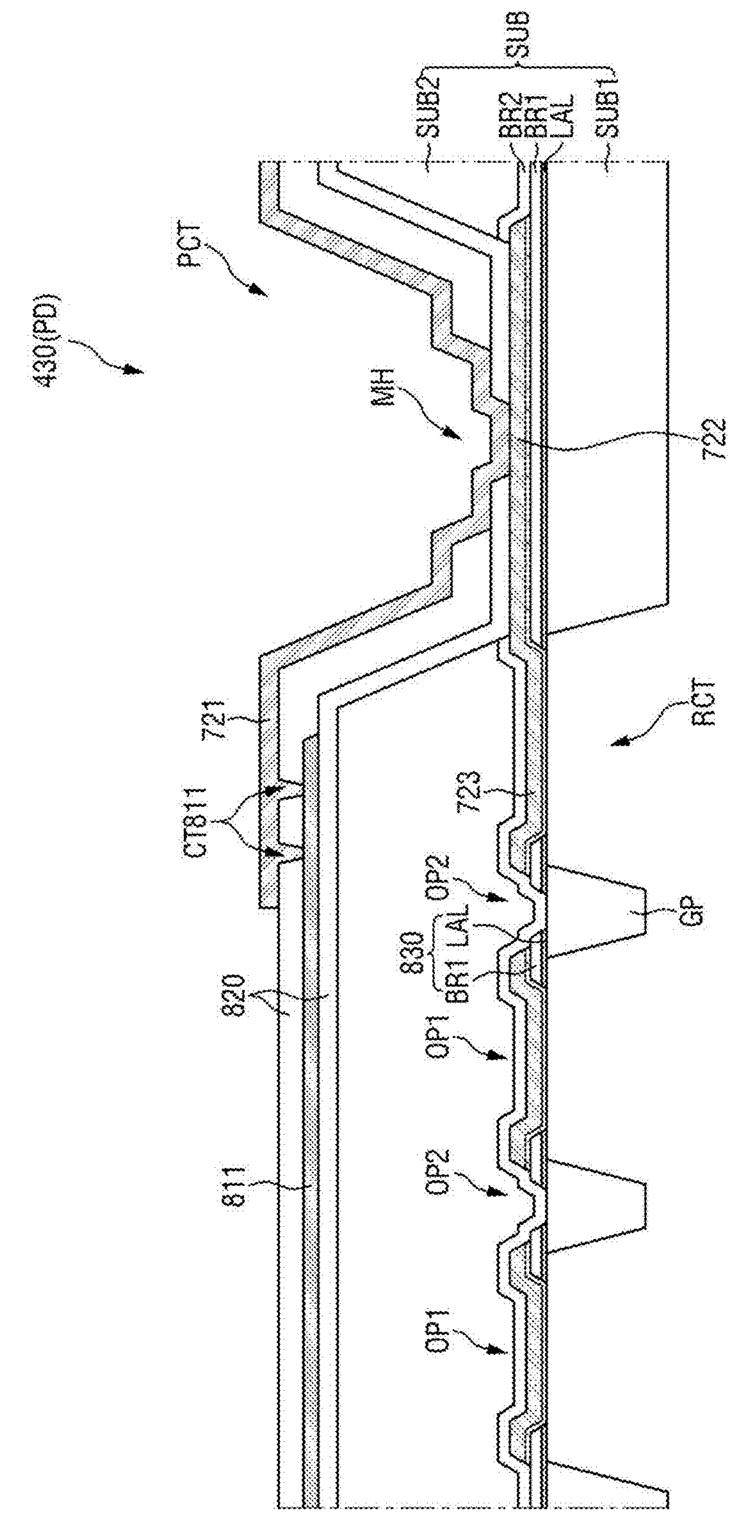

Referring to FIGS. 9 and 14, in an embodiment of the method of manufacturing the display device 1, rear contact holes RCT exposing the rear pad electrodes 723 and protrusion patterns GP covering the laser absorption layer LAL may be formed by etching the first substrate SUB1 (operation 916). The process of forming the protrusion patterns GP may be as follows. A patterned hard mask (not illustrated) is formed on the first substrate SUB1, and the rear contact holes RCT exposing the rear pad electrodes 723 are formed in a portion of the non-display area NDA using the hard mask (not illustrated) as an etch mask. Here, portions of the first substrate SUB1 which are not etched by the hard mask (not illustrated) may become the protrusion patterns GP.

According to an embodiment, each of the protrusion patterns GP may correspond to an area between neighboring rear pad electrodes 723 and may cover all or at least part of the laser absorption layer LAL of the pad defining layer 830 disposed between the neighboring rear pad electrodes 723.

Figure 15:
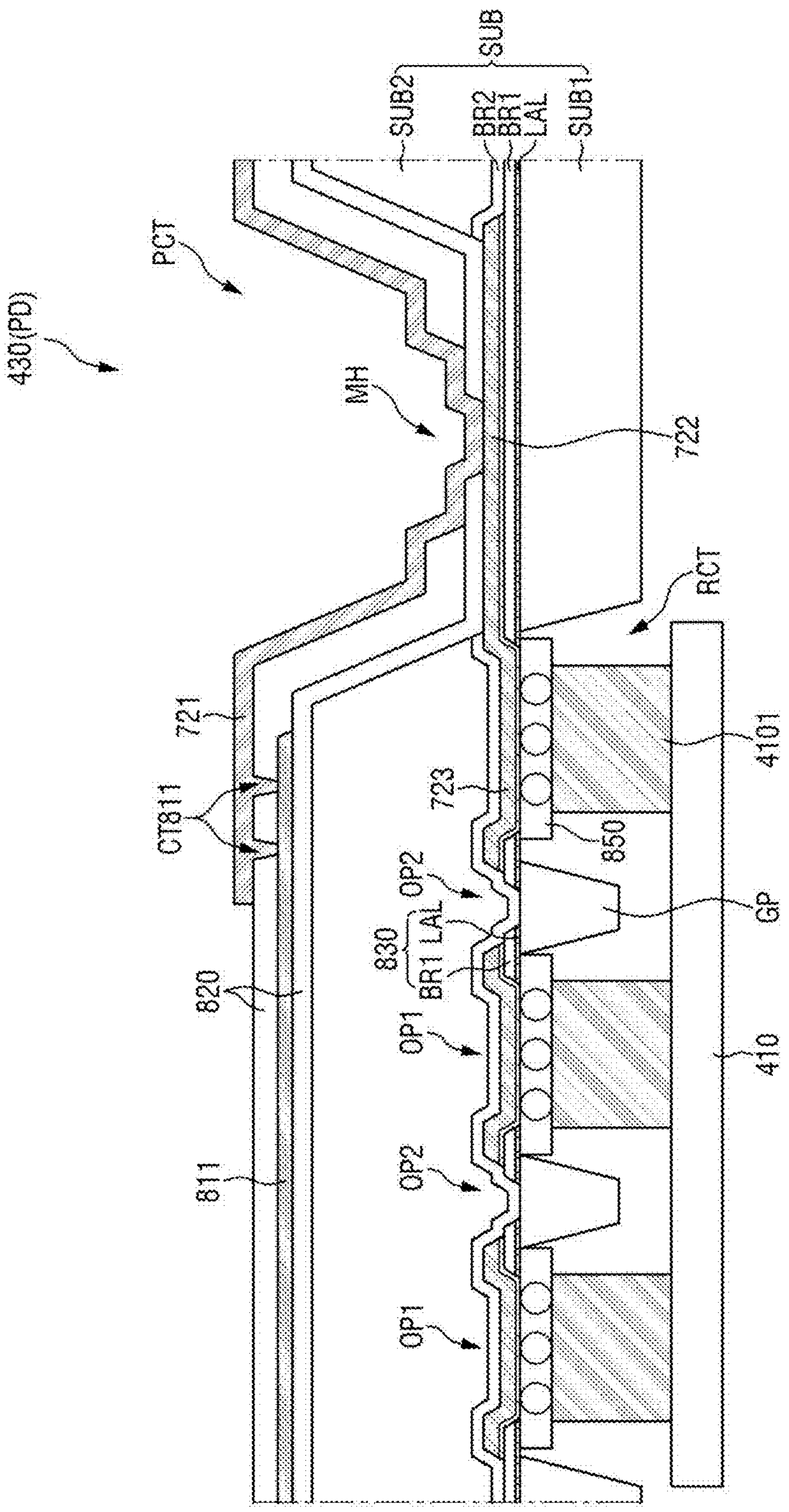

Referring to FIGS. 9 and 15, in an embodiment of the method of manufacturing the display device 1, the rear pad electrodes 723 and a driving board 410 may be bonded together through the rear contact holes RCT (operation 917). In an embodiment, for example, the driving board 410 may be a film-type board 410 such as an FPCB. In such an embodiment, bumps, i.e., pads 4101, of the driving board 410 may be attached to the rear contact holes RCT using an adhesive (not illustrated) such as a pressure sensitive adhesive (PSA) or an optically clear adhesive (OCA). The driving board 410 is not limited to a film-type board such as an FPCB and may also be a flexible board for mounting a COP-type integrated circuit. In another embodiment, for example, the flexible board may be a substrate formed by a same process as the substrate SUB of a display panel 10. In an embodiment, for example, the pads 4101 of the driving board 410 are bonded to the rear pad electrodes 723 using anisotropic conductive films 850, as shown in FIG. 15. However, the disclosure is not limited thereto. In another embodiment, for example, the pads 4101 of the driving board 410 may be electrically connected to the rear pad electrodes 723 using conductive ink or solder.

In the display device 1 according to an embodiment, since a plurality of protrusion patterns GP are formed between the rear contact holes RCT, a short circuit between neighboring rear pad electrodes 723 can be effectively prevented during the process of bonding the driving board 410. In an embodiment of the disclosure, since it is possible to prevent a short circuit while reducing a gap (i.e., pitch) between the rear pad electrodes 723, the degree of integration of the pad unit 430 can be increased.

Figure 16:
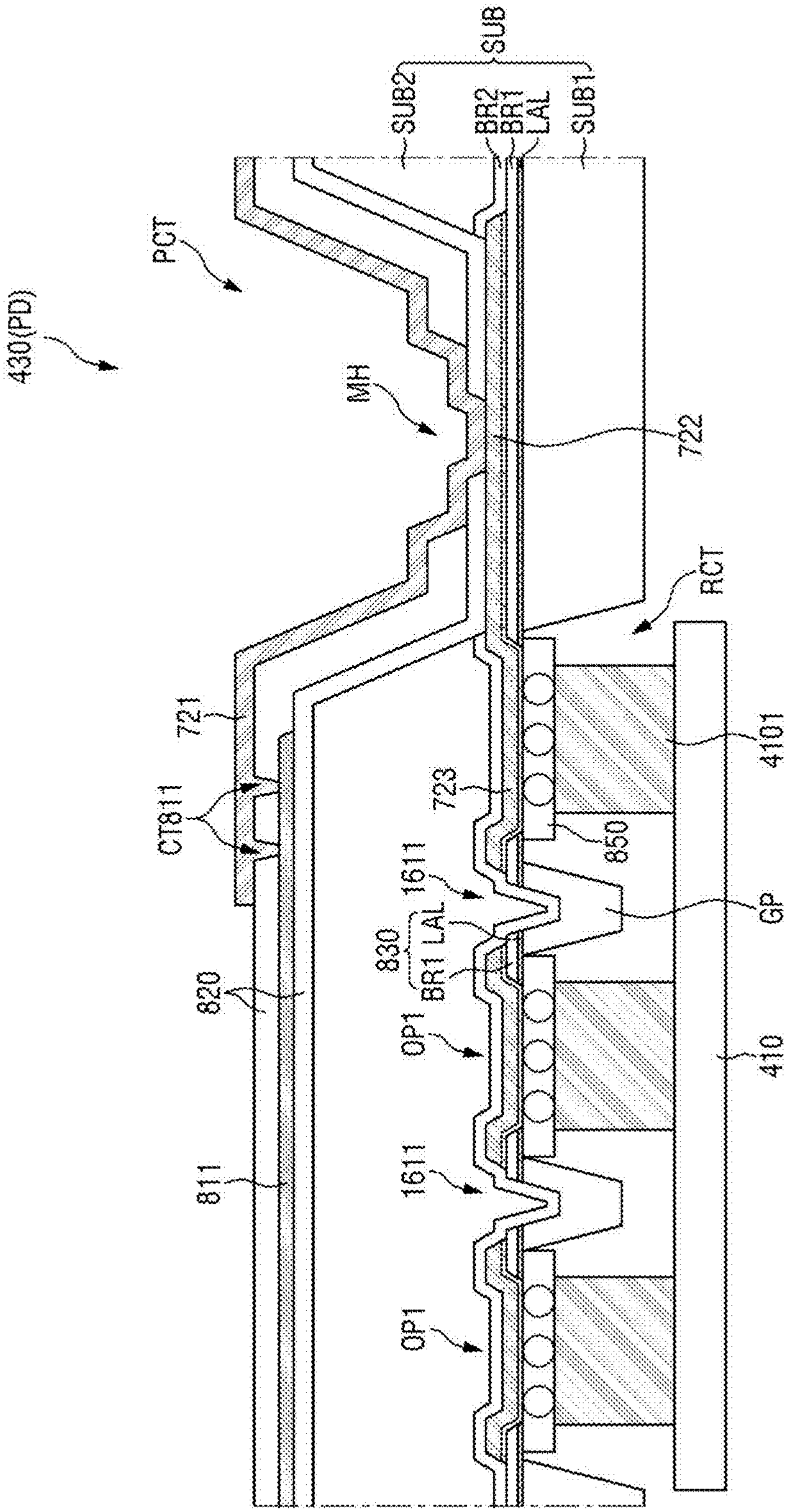
FIG. 16 is a cross-sectional view of a pad unit according to an embodiment in which a groove is formed in each protrusion pattern.

FIG. 16 is a cross-sectional view of a pad unit 430 according to an embodiment in which a groove 1611 is formed in each protrusion pattern GP.

The embodiment of FIG. 16 is substantially the same as the embodiment of FIG. 8 except that the groove 1611 is defined or formed in each protrusion pattern GP. In the description of the embodiment of FIG. 16, any repetitive detailed description of the same elements and features as those of the embodiment of FIG. 8 will be omitted.

Referring to FIG. 16, in an embodiment, each protrusion pattern GP may include the groove 1611 connected to a second opening OP2 of a pad defining layer 830. In an embodiment, for example, the groove 1611 may be formed by etching each protrusion pattern GP to a predetermined depth. In such an embodiment, a second barrier layer BR2 may be disposed in the groove 1611 of each protrusion pattern GP to cover the groove 1611.

In the embodiment of FIG. 16, since the groove 1611 is formed inside each protrusion pattern GP and the second barrier layer BR2 covers an inner circumferential surface of the groove 1611, the protrusion patterns GP can be designed more robust.

Figure 17:
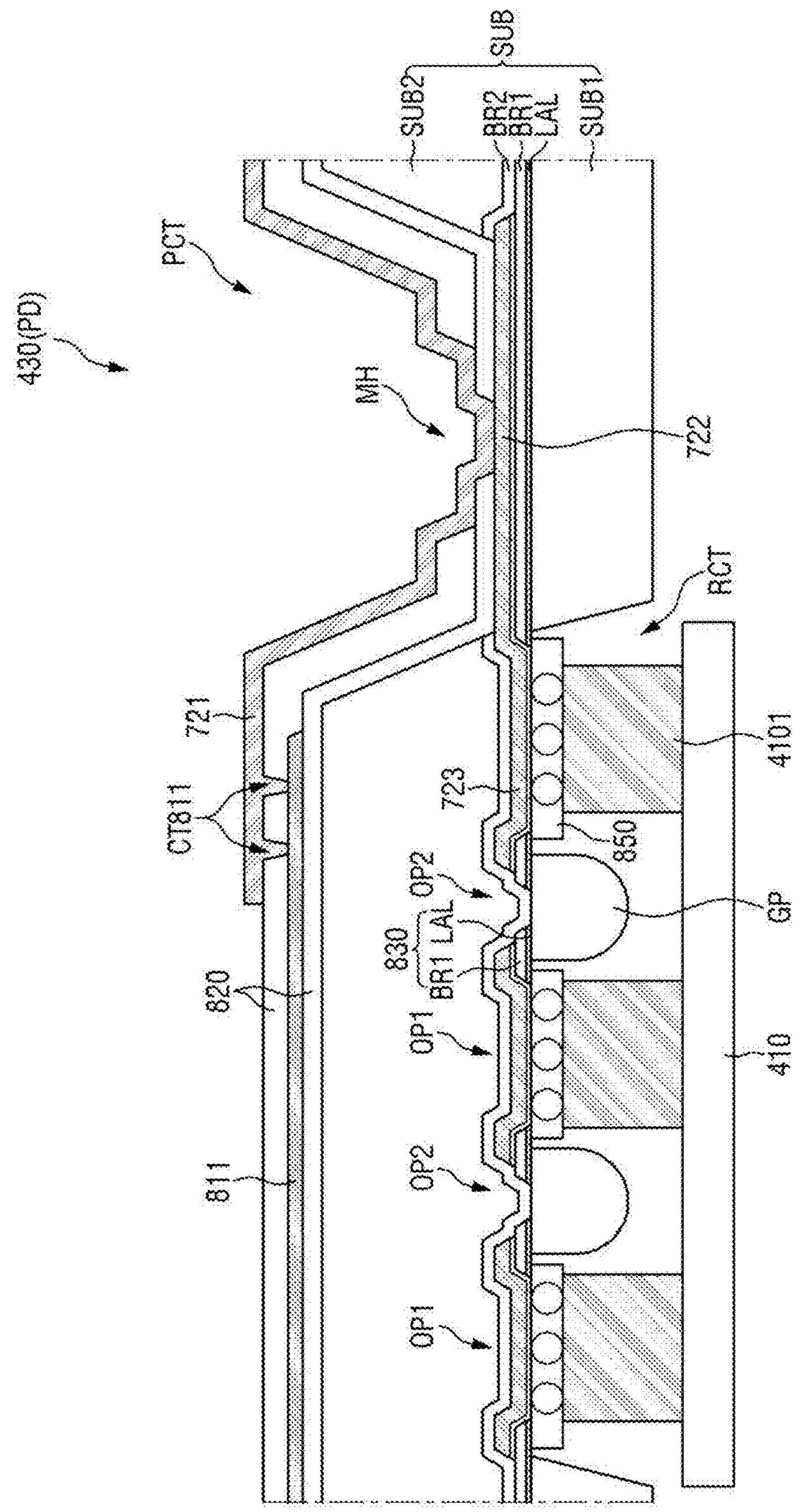
FIG. 17 is a cross-sectional view of a pad unit according to an embodiment which has dome-shaped protrusion patterns.

FIG. 17 is a cross-sectional view of a pad unit 430 according to an embodiment which has dome-shaped protrusion patterns GP.

The embodiment of FIG. 17 is substantially the same as the embodiment of FIG. 8 except that the protrusion patterns GP have a dome shape. In the description of the embodiment of FIG. 17, any repetitive detailed description of the same elements and features as those of the embodiment of FIG. 8 will be omitted.

Referring to FIG. 17, in an embodiment, the protrusion patterns GP may have a dome shape instead of a tapered shape. In an embodiment, for example, the protrusion patterns GP may have a dome shape with a curved surface facing toward the bottom (or a bottom surface) of a substrate SUB.

Figure 18:
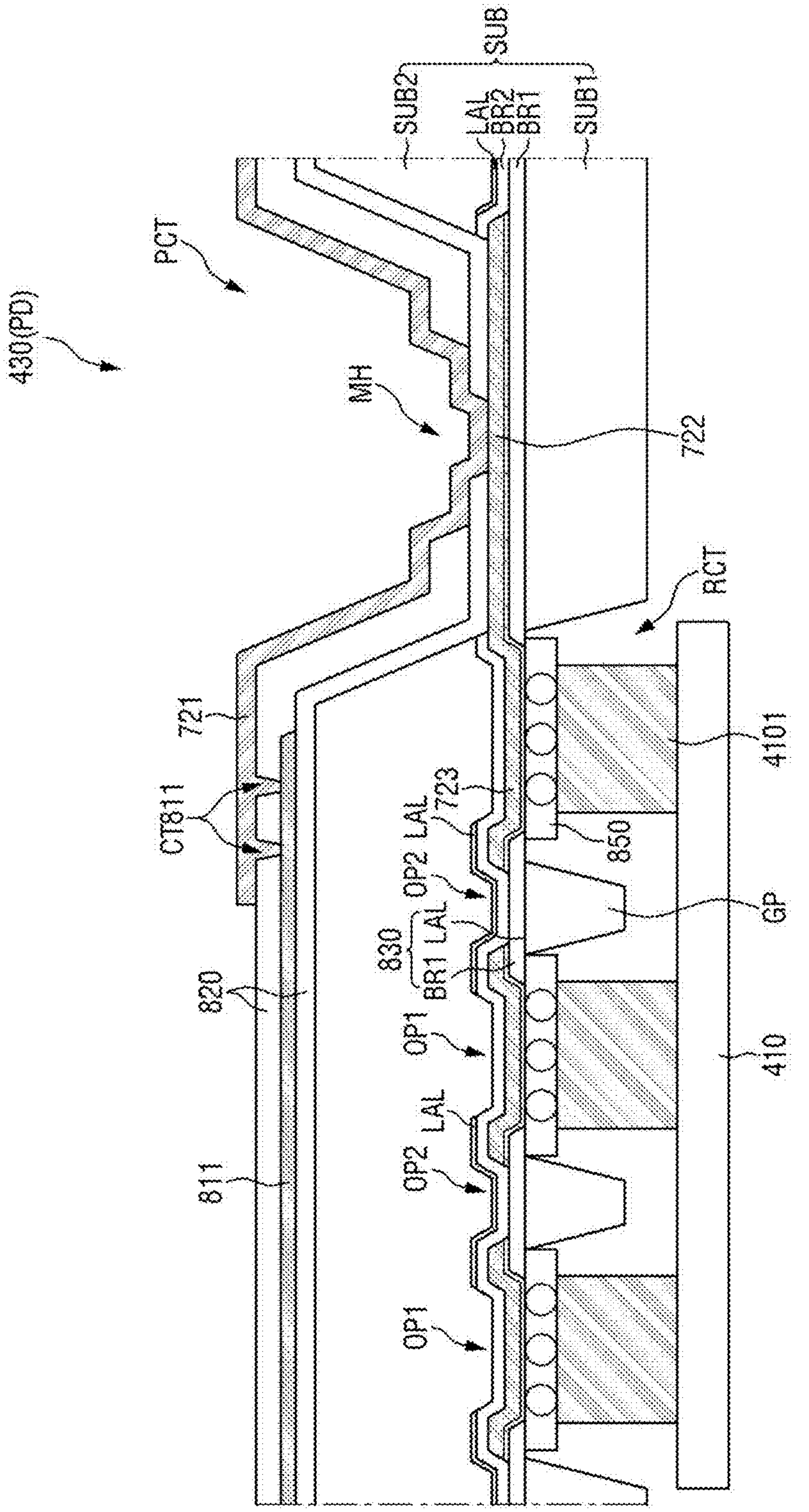
FIG. 18 is a cross-sectional view of a pad unit according to an embodiment in which a laser absorption layer is disposed on a second barrier layer.

FIG. 18 is a cross-sectional view of a pad unit 430 according to an embodiment in which a laser absorption layer LAL is disposed on a second barrier layer BR2.

The embodiment of FIG. 18 is substantially the same as the embodiment of FIG. 8 except that the laser absorption layer LAL is disposed on the second barrier layer BR2. In the description of the embodiment of FIG. 18, any repetitive detailed description of the same elements and features as those of the embodiment of FIG. 8 will be omitted.

Referring to FIG. 18, in an embodiment, the laser absorption layer LAL may be disposed on the second barrier layer BR2 and may overlap protrusion patterns GP. In an embodiment, as shown in FIG. 18, since the laser absorption layer LAL is disposed on the second barrier layer BR2, it is possible to prevent a short circuit in which neighboring rear pad electrodes 723 are electrically connected to each other through the laser absorption layer LAL.

According to an embodiment, as shown in FIG. 18, the laser absorption layer LAL may overlap the protrusion patterns GP, but may not be disconnected between neighboring rear pad electrodes 723. That is, the laser absorption layer LAL may be placed to correspond to an area between neighboring rear pad electrodes 723, but may be continuous without being disconnected.

Figure 19:
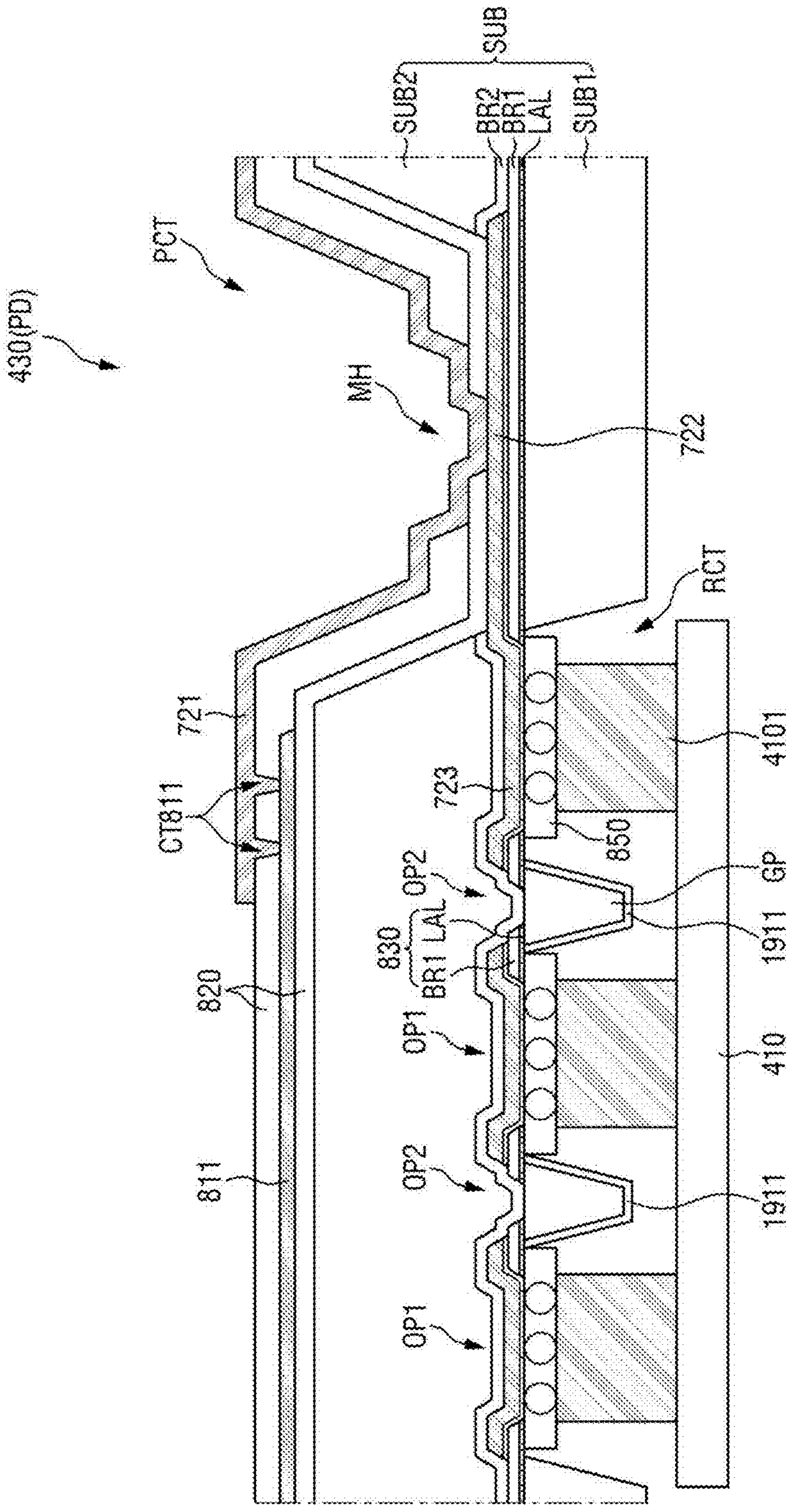
FIG. 19 is a cross-sectional view of a pad unit according to an embodiment in which each protrusion pattern is coated with a protective layer.

FIG. 19 is a cross-sectional view of a pad unit 430 according to an embodiment in which each protrusion pattern GP is coated with a protective layer 1911.

The embodiment of FIG. 19 is substantially the same as the embodiment of FIG. 8 except that a protective layer 1911 is coated on a surface of each protrusion pattern GP. In the description of the embodiment of FIG. 19, any repetitive detailed description of the same elements and features as those of the embodiment of FIG. 8 will be omitted.

Referring to FIG. 19, in an embodiment, the protective layer 1911 may be coated on the surface of each protrusion pattern GP. The protective layer 1911 may protect, for example, the protrusion patterns GP and a laser absorbing layer LAL, a first barrier layer BR1, a second barrier layer BR2 and a second substrate SUB2 overlapping the protrusion patterns GP from laser light. The protective layer 1911 may include, for example, a material that absorbs or reflects infrared laser light.

In a display device according to embodiments, it is possible to increase the area of a display area by reducing the area of a non-display area.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
- a substrate comprising a first substrate, a first barrier layer, a second barrier layer, and a second substrate, which are sequentially stacked therein;
- a thin-film transistor layer, a light emitting element layer, an encapsulation layer, and a touch sensing unit, which are sequentially stacked on the second substrate; and
- a pad unit disposed in a non-display area of the substrate and comprising a plurality of pads connected to a driving board disposed on the first substrate,
- wherein each of the pads comprises:
  - an inorganic layer and a pad electrode, which are sequentially stacked on an inner circumferential surface of a pad contact hole defined through the second substrate and the second barrier layer;
  - a rear pad line disposed on the first barrier layer and connected to the pad electrode through a middle hole defined through the inorganic layer inside the pad contact hole; and
  - a rear pad electrode extending from the rear pad line and connected to the driving board under the substrate through a rear contact hole defined through the first substrate,
  - wherein a pad defining layer and a protrusion pattern covering the pad defining layer from under the substrate are disposed between neighboring rear pad electrodes, wherein the pad defining layer comprises a laser absorption layer and the first barrier layer.

2. The display device of claim 1, wherein the laser absorption layer is disposed between the first substrate and the first barrier layer.

3. The display device of claim 1, wherein
- a plurality of first openings and a second opening disposed between neighboring first openings are defined through the pad defining layer, and
- the rear pad electrodes are disposed in the first openings.

4. The display device of claim 3, wherein the laser absorption layer of the pad defining layer is disconnected in the second opening.

5. The display device of claim 4, wherein the second opening of the pad defining layer is covered by the second barrier layer.

6. The display device of claim 1, wherein the laser absorption layer comprises a semiconductor layer.

7. The display device of claim 6, wherein the semiconductor layer of the laser absorption layer comprises amorphous silicon.

8. The display device of claim 1, wherein a depth of the protrusion pattern in a thickness direction of the substrate is lower than a depth of the rear contact hole in the thickness direction of the substrate.

9. The display device of claim 1, wherein the protrusion pattern has a tapered tape having a width decreasing as being toward a bottom surface of the substrate.

10. The display device of claim 5, wherein the protrusion pattern has a dome shape having a curved surface facing toward a bottom surface of the substrate.

11. The display device of claim 5, wherein
- a groove is defined the protrusion pattern to be connected to the second opening of the pad defining layer, and
- the groove of the protrusion pattern is covered by the second barrier layer.

12. A display device comprising:
- a substrate comprising a first substrate, a first barrier layer, a second barrier layer, and a second substrate, which are sequentially stacked therein;
- a thin-film transistor layer, a light emitting element layer, an encapsulation layer, and a touch sensing unit, which are sequentially stacked on the second substrate; and
- a pad unit disposed in a non-display area of the substrate and comprising a plurality of pads connected to a driving board disposed on the first substrate,
- wherein each of the pads comprises:
  - an inorganic layer and a pad electrode sequentially stacked on an inner circumferential surface of a pad contact hole defined through the second substrate and the second barrier layer;
  - a rear pad line disposed on the first barrier layer and connected to the pad electrode through a middle hole defined through the inorganic layer inside the pad contact hole; and
  - a rear pad electrode extending from the rear pad line and connected to the driving board under the substrate through a rear contact hole defined through the first substrate,
  - wherein a pad defining layer defined by a patterned portion of the first barrier layer, a laser absorption layer disposed on the second barrier layer to overlap the pad defining layer, and a protrusion pattern covering the pad defining layer from under the substrate are disposed between neighboring rear pad electrodes.

13. The display device of claim 12, wherein
- a plurality of first openings and a second opening disposed between neighboring first openings are defined through the pad defining layer, and
- the rear pad electrodes are disposed in the first openings.

14. The display device of claim 12, wherein the laser absorption layer comprises a semiconductor layer.

15. The display device of claim 14, wherein the semiconductor layer of the laser absorption layer comprises amorphous silicon.

16. The display device of claim 12, wherein a depth of the protrusion pattern in a thickness direction of the substrate is lower than a depth of the rear contact hole in the thickness direction.

17. The display device of claim 12, wherein the protrusion pattern has a tapered tape having a width decreasing as being toward a bottom surface of the substrate.

18. The display device of claim 12, wherein the inorganic layer is disposed in a same layer as at least one selected from inorganic layers included in the thin-film transistor layer.

19. The display device of claim 12, wherein the pad electrode is disposed in a same layer as a source electrode or a drain electrode of the thin-film transistor layer.

20. The display device of claim 12, wherein the pad unit is disposed in an outermost area of the non-display area in which the encapsulation layer is not disposed.

* * * * *